(12) United States Patent
Hamamoto et al.

(10) Patent No.: US 10,502,922 B2
(45) Date of Patent: Dec. 10, 2019

(54) LASER ARRAY DEVICE

(71) Applicant: MITSUBISHI HEAVY INDUSTRIES, LTD., Tokyo (JP)

(72) Inventors: Koichi Hamamoto, Tokyo (JP); Shingo Nishikata, Tokyo (JP); Tomoya Morioka, Tokyo (JP); Atsushi Ochiai, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 45 days.

(21) Appl. No.: 15/556,484

(22) PCT Filed: Mar. 16, 2016

(86) PCT No.: PCT/JP2016/058250

§ 371 (c)(1),
(2) Date: Sep. 7, 2017

(87) PCT Pub. No.: WO2016/148165

PCT Pub. Date: Sep. 22, 2016

(65) Prior Publication Data

US 2018/0074282 A1 Mar. 15, 2018

(30) Foreign Application Priority Data

Mar. 18, 2015 (JP) .................. 2015-055367

(51) Int. Cl.
*G02B 7/02* (2006.01)
*G02B 3/00* (2006.01)
*H01S 3/04* (2006.01)
*H01S 3/23* (2006.01)
*H01S 5/024* (2006.01)
*H01S 3/00* (2006.01)
*G02B 7/00* (2006.01)
(Continued)

(52) U.S. Cl.
CPC ............. *G02B 7/028* (2013.01); *G02B 3/005* (2013.01); *G02B 3/0062* (2013.01); *G02B 7/008* (2013.01);
(Continued)

(58) Field of Classification Search
CPC .... G02B 7/028; G02B 3/005; G02B 19/0047; G02B 7/021; H01S 3/0407; H01S 3/2383
See application file for complete search history.

(56) References Cited

U.S. PATENT DOCUMENTS 6,888,853 B1 5/2005 Jürgensen
2004/0091013 A1 5/2004 Yamaguchi et al.
2011/0249342 A1 10/2011 Scaggs

FOREIGN PATENT DOCUMENTS

JP 02-050105 2/1990
JP 5-212571 8/1993
(Continued)

OTHER PUBLICATIONS

International Preliminary Report on Patentability dated Sep. 28, 2017 in International Application No. PCT/JP2016/058250.
(Continued)

*Primary Examiner* — Jack Dinh
(74) *Attorney, Agent, or Firm* — Wenderoth, Lind & Ponack, L.L.P.

(57) ABSTRACT

A laser array device includes a first lens tube (10) through which a first laser beam (1) passes, a second lens tube (20) through which a second laser beam (2) passes, a support mechanism (72, 74) disposed to support the first lens tube (10) and the second lens tube to be parallel to each other, a first lens (12) arranged in the first lens tube (10), and a second lens (22) arranged in the second lens tube (20). A first temperature-rise suppressing mechanism (110) is disposed in the first lens tube (10) to suppress temperature rise of the first lens tube (10).

10 Claims, 19 Drawing Sheets

(51) Int. Cl.
*H01S 3/10* (2006.01)
*G02B 19/00* (2006.01)

(52) U.S. Cl.
CPC .............. *G02B 7/021* (2013.01); *H01S 3/005* (2013.01); *H01S 3/0407* (2013.01); *H01S 5/02438* (2013.01); *G02B 19/0047* (2013.01); *H01S 3/10* (2013.01); *H01S 3/2383* (2013.01)

(56) References Cited

FOREIGN PATENT DOCUMENTS

| JP | 2003-181671 | 7/2003 |
|---|---|---|
| JP | 2003-344802 | 12/2003 |
| JP | 2004-82166 | 3/2004 |
| JP | 2006-212689 | 8/2006 |
| JP | 2010-167451 | 8/2010 |
| JP | 2013-139039 | 7/2013 |
| JP | 5255795 | 8/2013 |

OTHER PUBLICATIONS

Extended European Search Report dated Feb. 19, 2018 in European Patent Application No. 16764994.6.

International Search Report dated Jun. 14, 2016 in International Application No. PCT/JP2016/058250.

Mikhail Vorontsov et al., "Coherent Beam Combining and Atmospheric Compensation with Adaptive Fiber Array Systems", Coherent Laser Beam Combining, First Edition. Edited by Arnaud Brignon, 2013, p. 167-191.

Notification of Reasons for Refusal dated Aug. 8, 2018 in Japanese Patent Application No. 2015-055367, with Machine Translation.

LASER ARRAY DEVICE

TECHNICAL FIELD

The present invention relates to a laser array device, and especially to a laser array device having a temperature-rise suppressing mechanism.

BACKGROUND ART

The technique is known of superimposing a plurality of laser beams to increase the laser output.

As related techniques, Patent Literature 1 discloses an image forming apparatus. The image forming apparatus disclosed in Patent Literature 1 includes a housing which covers an optical system from a laser beam source to an oblique mirror, and a cooling fan which cools the housing.

Also, Non-Patent Literature 1 discloses a fiber array system which includes a seed laser, a fiber splitter, phase shifters, fiber amplifiers, and a fiber array transmitter. In Non-Patent Literature 1, the fiber splitter splits the laser beam received from the seed laser. The phase shifter shifts the phase of the split laser beam. The fiber amplifier amplifies the laser beam received from the phase shifter. The fiber array transmitter focuses a plurality of laser beams received from the fiber amplifiers for a target.

CITATION LIST

[Patent Literature 1] Japanese Patent 5,255,795
[Non-Patent Literature 1] Mikhail Vorontsov et al., "Coherent Beam Combining and Atmospheric Compensation with Adaptive Fiber Array Systems", Coherent Laser Beam Combining, First Edition. Edited by Arnaud Brignon, 2013, p. 167-191

SUMMARY OF THE INVENTION

An object of the present invention is to provide a laser array device which suppresses temperature rise of a lens tube to prevent from the degradation of optical performance.

In some embodiments, a laser array device includes a plurality of lens tubes comprising a first lens tube through which a first laser beam passes and a second lens tube through which a second laser beam passes; a support mechanism disposed to support the plurality of lens tubes to be parallel to each other; at least one first lens arranged in the first lens tube; at least one second lens arranged in the second lens tube; and a first temperature-rise suppressing mechanism arranged to the first lens tube to suppress temperature rise of the first lens tube.

According to the present invention, the laser array device is provided to suppress the lens tube temperature rise to prevent from the degradation of the optical performance.

BRIEF DESCRIPTION OF THE DRAWINGS

The attached drawings are incorporated into this Specification to help the description of embodiments. Note that the drawings should not be interpreted to limit the present invention to illustrated and described examples.

DESCRIPTION OF THE EMBODIMENTS

Hereinafter, a laser array device according to embodiments will be described with reference to the attached drawings. In the following detailed description, many detailed specific matters are disclosed for the purpose of the explanation to provide the comprehensive understanding of the embodiments. However, it would be apparent that the one or more embodiments are executable without these detailed specific matters.

Definition of the Term

In this Specification, "a spot diameter" means a diameter of a laser beam in a plane perpendicular to the propagation direction of the laser beam. The spot diameter is a diameter of an area where the laser beam intensity in the plane is equal to or greater than $1/e^2$ of the maximum intensity of the laser beam (e is the bottom of natural logarithm).

In this Specification, an axis parallel to the longitudinal direction of a first lens tube is defined as an X axis. In the first lens tube, a direction to which a first laser beam propagates is defined as a positive direction of the X axis.

(Matters Recognized by Inventors)

Figure 1:
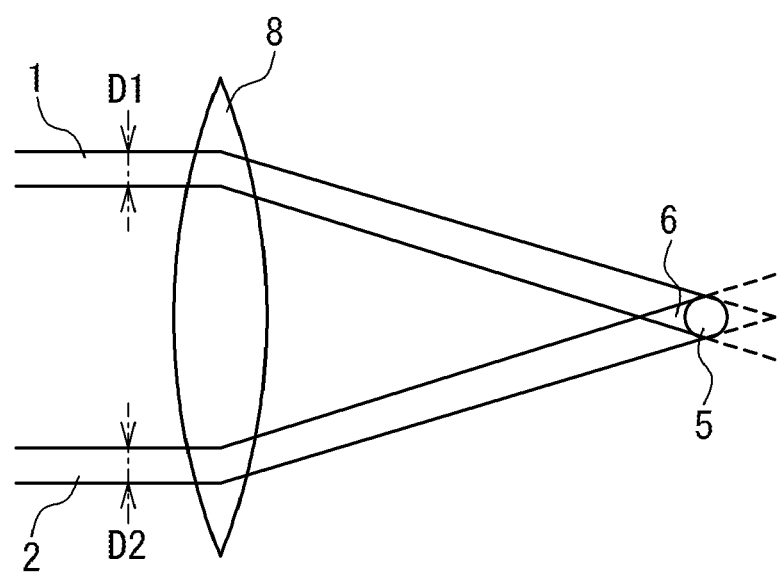
FIG. 1 is a schematic side view showing an irradiation state of a laser beam.
Figure 2:
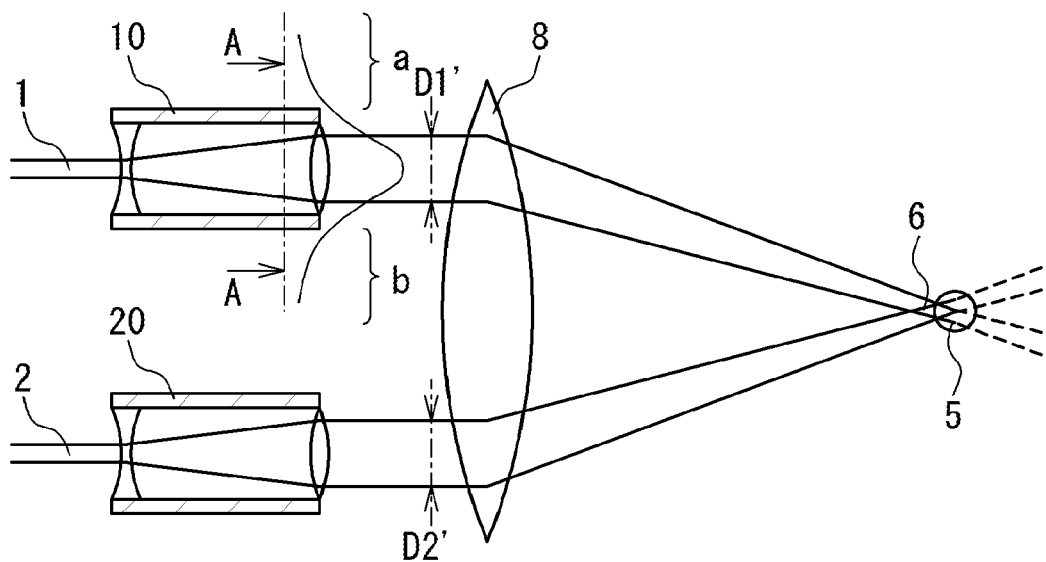
FIG. 2 is a schematic side view showing an irradiation state of the laser beams.
Figure 3:
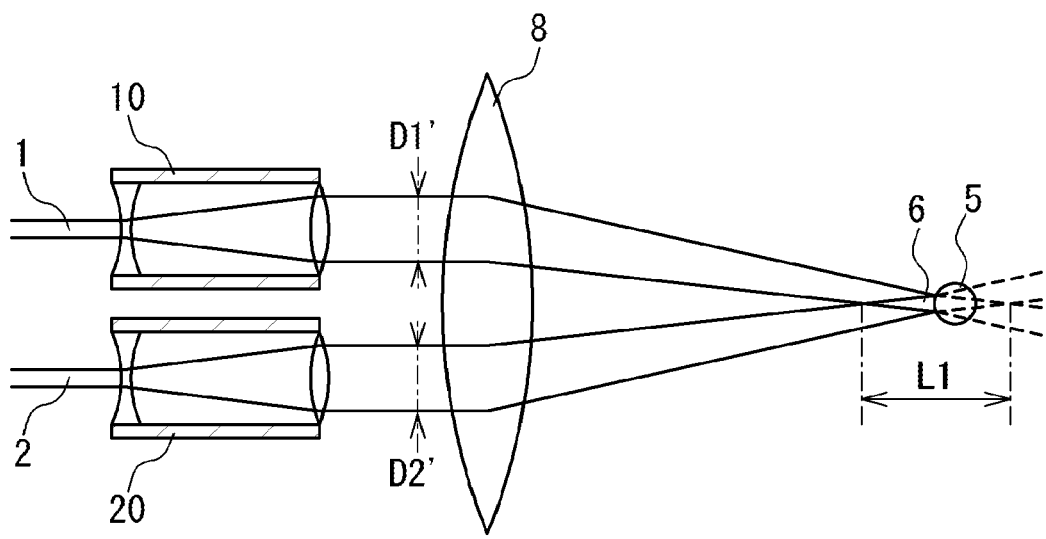
FIG. 3 is a schematic side view showing an irradiation state of the laser beams.

Referring to FIG. 1 to FIG. 3, the matters recognized by the inventors will be described. FIG. 1 to FIG. 3 is schematic side views showing the irradiation state of the laser beam.

In an example shown in FIG. 1, a first laser beam 1 and a second laser beam 2 are irradiated for a target 5. The irradiation direction of the first laser beam 1 is changed to the direction for the target 5 by a condenser lens 8 (e.g. a convex lens). Note that in the example shown in FIG. 1, the spot diameter of the first laser beam 1 incident on the condenser lens 8 is D1. The irradiation direction of the second laser beam 2 is changed to the direction for the target 5 by the condenser lens 8. Note that in an example shown in FIG. 1, the spot diameter of the second laser beam 2 incident on the condenser lens 8 is D2. The first laser beam 1 and the second laser beam are superimposed and the superimposed synthetic laser beam 6 reaches the target 5.

FIG. 2 shows a method of increasing the intensity of the synthetic laser beam. In an example shown in FIG. 2, the spot diameter of the first laser beam 1 is expanded by an optical element arranged in the first lens tube 10. As a result, the spot diameter of the first laser beam 1 incident on the condenser lens 8 becomes D1' (D1'>D1). Also, the spot diameter of the second laser beam 2 is expanded by an optical element arranged in the second lens tube 20. As a result, the spot diameter of the second laser beam 2 incident on the condenser lens 8 becomes D2' (D2'>D2). When the spot diameter D1' of the first laser beam 1 incident on the condenser lens 8 is expanded and the spot diameter D2' of the second laser beam 2 incident on the condenser lens 8 is expanded, it is possible to increase an energy density of each laser beam in the focus position (the existing position of the target 5). As a result, the intensity of the synthetic laser beam 6 increases.

The intensity distribution of the first laser beam 1 in the section viewed in the direction of arrows A-A in FIG. 2 has a curve shown by f in FIG. 2 (e.g. a Gaussian distribution curve), when it is supposed that the first lens tube 10 does not exist. However, actually, of the laser beam shown by the intensity distribution f, a part of a region a and a region b is incident on the first lens tube 10, since the first lens tube 10 exists. Almost part of the laser beam incident on the first lens tube 10 is converted into heat energy. As a result, the temperature of the first lens tube 10 rises.

Since the first lens tube 10 can radiate heat to the periphery in the example shown in FIG. 2, the temperature rise of the first lens tube 10 by the first laser beam does not become a big problem. In the same way, since the second lens tube 20 can radiate heat to the periphery, the temperature rise of the second lens tube 20 by the second laser beam does not become a big problem.

Next, as shown in FIG. 3, it is assumed that the first lens tube 10 and the second lens tube 20 are arranged in the neighborhood of each other. The inventors recognized that the depth L1 of the synthetic laser beam 6 becomes longer (in other words, the length of a part in which the first laser beam and the second laser beam overlap) as the effect which the first lens tube 10 and the second lens tube 20 are arranged in the neighborhood of each other. Even if the depth of the synthetic laser beam 6 becomes longer so that the sight of the laser beam shifts into the depth direction to the target 5, the superimposed synthetic laser beam 6 reaches the target 5 effectively. Also, when the lens tubes are made close to each other, the energy density of the whole laser beam incident on the condenser lens 8 can be increased. As a result, the light collection characteristic of the whole laser beam improves. Also, by making a distance between the lens tube 10 and the lens tube 20 small, it becomes possible to additionally arrange other lens tubes which emit laser beams for the condenser lens 8. As a result, the energy density of the whole laser beam can be more increased.

On the other hand, when the first lens tube 10 and the second lens tube 20 are arranged close to each other, the temperature around the first lens tube 10 rises due to existence of the second lens tube 20, as shown in FIG. 3. Also, a part of the heat radiated from the second lens tube 20 is incident on the first lens tube 10. Therefore, in an example shown in FIG. 3, the temperature rise of the first lens tube 10 is larger than in the example shown in FIG. 2. In the same way, in the example shown in FIG. 3, the temperature rise of the second lens tube 20 is larger than in the example shown in FIG. 2.

As a result of the temperature rise of the first lens tube 10, a warp occurs in the first lens tube 10. The optical performance of an optical system arranged in the first lens tube degrades because of the warp of the first lens tube 10. In the same way, as a result of the temperature rise of the second lens tube 20, a warp occurs in the second lens tube 20. The optical performance of an optical system arranged in the second lens tube degrades because of the warp of the second lens tube 20.

Note that FIG. 1 to FIG. 3 are diagrams temporarily used to explain the matters recognized by the inventors. Therefore, FIG. 1 to FIG. 3 are not prior arts.

(Configuration of Laser Array Device)

Figure 4:
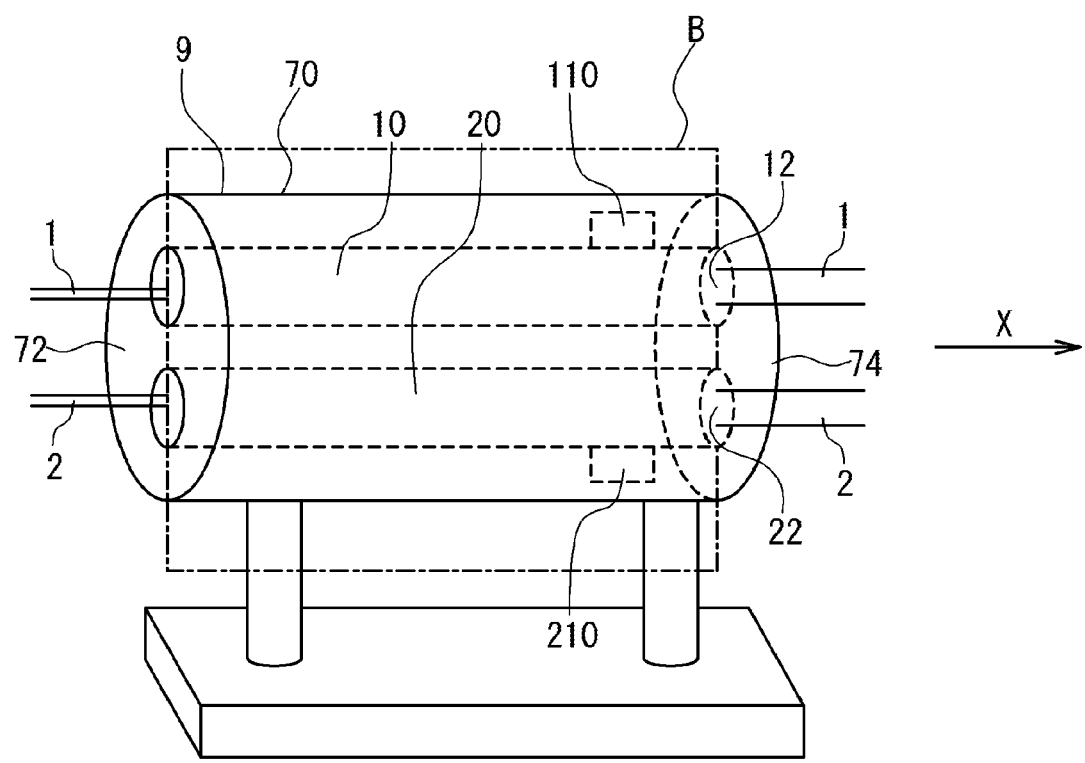
FIG. 4 is a schematic perspective view showing an example of the configuration of a laser array device.
Figure 5:
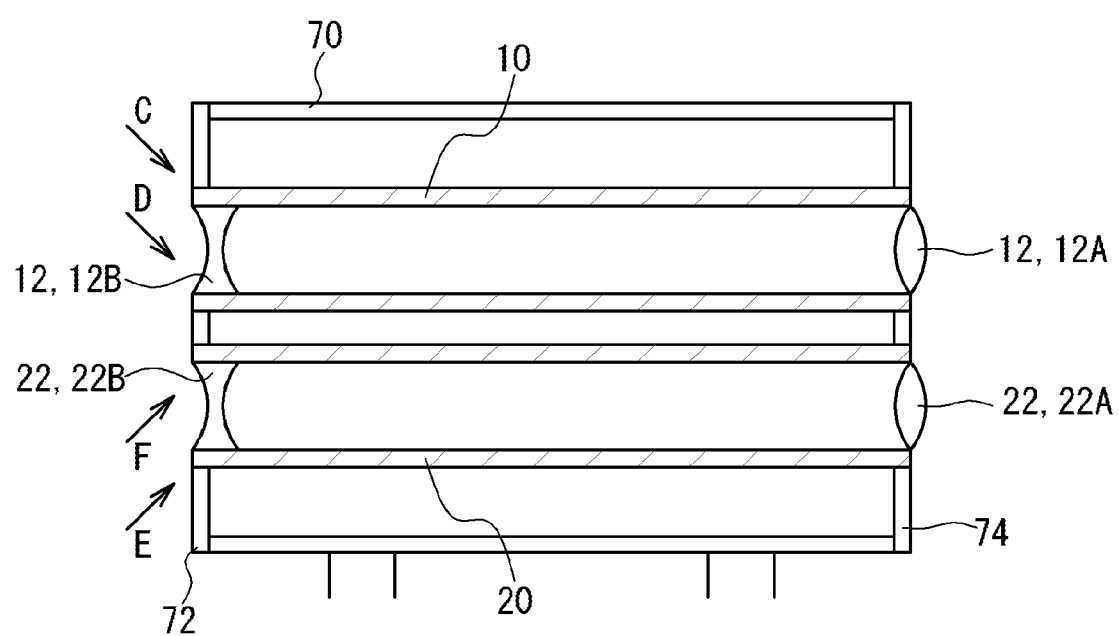
FIG. 5 is a schematic sectional view showing a cross section in a plane B of FIG. 4.
Figure 6A:
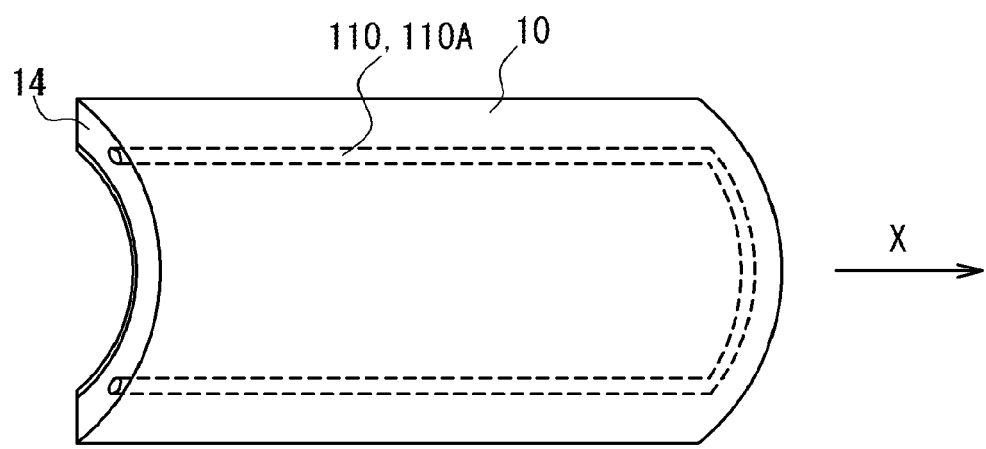
FIG. 6A is a schematic perspective view of a half lens tube portion of a first lens tube when being viewed from the direction of an arrow C in FIG. 5.
Figure 6B:
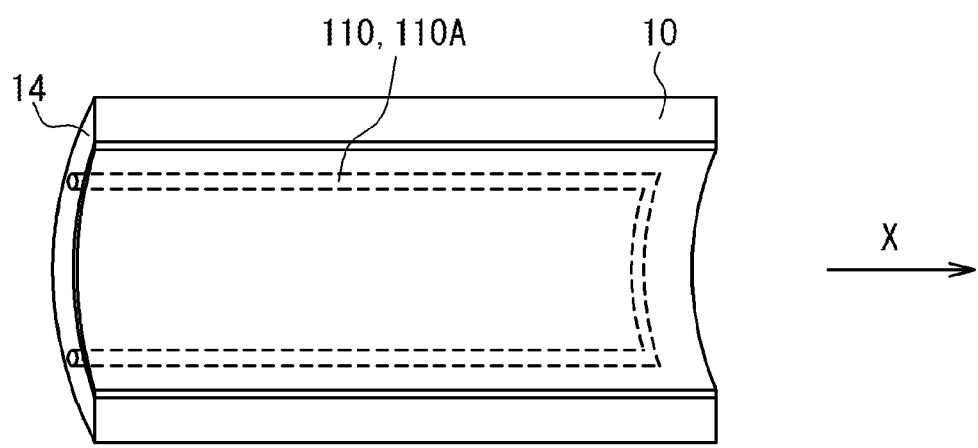
FIG. 6B is a schematic perspective view of the remaining half lens tube portion of the first lens tube when being viewed from the direction of an arrow D in FIG. 5.

The laser array device 9 according to the embodiments will be described with reference to FIG. 4 to FIG. 6N. FIG. 4 is a schematic perspective view showing an example of configuration of the laser array device 9. FIG. 5 is a schematic sectional view showing a section in a plane B of FIG. 4. FIG. 6A, FIG. 6C, FIG. 6E, FIG. 6G, FIG. 6I, and FIG. 6K are schematic perspective views showing a half lens tube portion of the first lens tube 10 when being viewed from the direction of an arrow C in FIG. 5. FIG. 6B, FIG. 6D, FIG. 6F, FIG. 6H, FIG. 6J, and FIG. 6L are schematic perspective views of the remaining half lens tube portion of the first lens tube 10 when being viewed from the direction of an arrow D in FIG. 5. FIG. 6M is a schematic perspective view of a half lens tube portion of the second lens tube 20 when being viewed from the direction of an arrow E in FIG. 5. FIG. 6N is a schematic perspective view of the remaining half lens tube portion of the second lens tube 20 when being viewed from the direction of an arrow F in FIG. 5.

Referring to FIG. 4 and FIG. 5, the laser array device 9 includes the first lens tube 10, the second lens tube 20, a support mechanism (72, 74) to support the first lens tube 10 and the second lens tube 20, a first lens 12 arranged in the first lens tube 10, a second lens 22 arranged in the second lens tube 20, a first temperature-rise suppressing mechanism 110 and a second temperature-rise suppressing mechanism 210. Note that the first temperature-rise suppressing mechanism 110 shown in FIG. 4 is mere exemplification. The kind and arrangement of first temperature-rise suppressing mechanism 110 are optional. Also, the second temperature-rise suppressing mechanism 210 shown in FIG. 4 is mere exemplification. The kind and arrangement of second temperature-rise suppressing mechanism 210 are optional.

The first laser beam 1 is incident on the first lens tube 10, and the first laser beam 1 is emitted from the first lens tube 10. In the other words, the first laser beam 1 passes through the first lens tube 10.

The second laser beam 2 is incident on the second lens tube 20 and the second laser beam 2 is emitted from the second lens tube 20. In the other words, the second laser beam 2 passes through the second lens tube 20.

The support mechanism (72, 74) supports the first lens tube 10 and the second lens tube 20 such that the first lens tube 10 and the second lens tube 20 become parallel. The support mechanism (72, 74) may be a first end wall 72 of the housing 70 and a second end wall 72 of the housing 70 which surround the first lens tube 10 and the second lens tube 20. Note that the support mechanism may be whatever type of mechanism, if being the mechanism to support the first lens tube 10 and the second lens tube 20 such that the first lens tube 10 and the second lens tube 20 become parallel.

The first lens 12 includes, for example, a lens 12A which converts a diffusion laser beam incident to the first lens 12 into a parallel laser beam or a focusing laser beam. Alternatively or additionally, the first lens 12 contains, for example, a lens 12B which converts the parallel laser beam incident to the first lens 12 into the diffusion laser beam.

The second lens 22 includes, for example, a lens 22A which converts a diffusion laser beam incident to the second lens 22 into a parallel laser beam or a focusing laser beam. Alternatively or additionally, for example, the second lens 22 contains a lens 22B which converts the parallel laser beam incident to the second lens 22 into the diffusion laser beam.

(First Temperature-Rise Suppressing Mechanism 110)

Next, referring to FIG. 6A and FIG. 6B, an example of the first temperature-rise suppressing mechanism 110 will be described. FIG. 6A is a schematic perspective view of a half lens tube portion of the first lens tube 10 (for example, an upper-half lens tube portion when the lower-half lens tube portion is removed virtually) when being viewed from the direction of an arrow C in FIG. 5. FIG. 6B is a schematic perspective view of the remaining half lens tube portion of the first lens tube 10 (for example, the lower-half lens tube portion when the upper-half lens tube portion is removed virtually) when being viewed from the direction shown by arrow D in FIG. 5.

The first temperature-rise suppressing mechanism 110 is a mechanism arranged in the first lens tube 10 to suppress the temperature rise of the first lens tube 10. In an example shown in FIG. 6A and FIG. 6B, the first temperature-rise suppressing mechanism 110 has a first inner coolant passage 110A. The first inner coolant passage 110A is arranged inside the wall 14 of the first lens tube 10. Liquid coolant or gaseous coolant flows through the first inner coolant passage 110A, so that the wall 14 of the first lens tube 10 is cooled. As a result, heat deformation of the first lens tube 10 is suppressed and the degradation of the optical performance of an optical system arranged in the first lens tube 10 is suppressed.

When the first temperature-rise suppressing mechanism 110 has the first inner coolant passage 110A, the wall 14 is most effectively cooled. Also, when the first inner coolant passage 110A is arranged inside the wall 14 of the first lens tube 10, the laser array device 9 which contains the first lens tube can be compactly configured, as compared with a case of arranging a first outer coolant passage 110B on the outer circumferential surface of the first lens tube 10.

(Modification Example 1 of First Temperature-Rise Suppressing Mechanism 110)

Figure 6C:
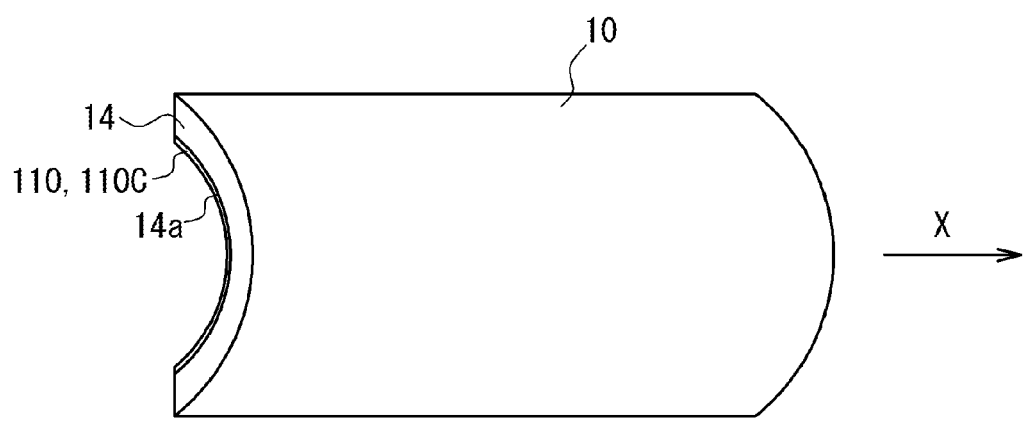
FIG. 6C is a schematic perspective view of the half lens tube portion of the first lens tube when being viewed from the direction of the arrow C in FIG. 5.
Figure 6D:
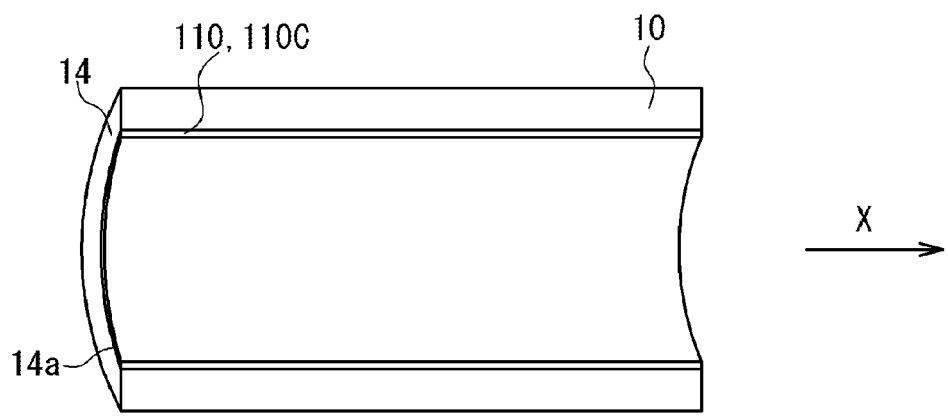
FIG. 6D is a schematic perspective view of the remaining half lens tube portion of the first lens tube when being viewed from the direction of the arrow D in FIG. 5.

Referring to FIG. 6C and FIG. 6D, a modification example 1 of the first temperature-rise suppressing mechanism 110 will be described. FIG. 6C is a schematic perspective view of a half lens tube portion of the first lens tube 10 (for example, an upper-half lens tube portion when a lower-half lens tube portion is removed virtually) when being viewed from the direction of the arrow C in FIG. 5. FIG. 6D is a schematic perspective view of of the remaining half lens tube portion of the first lens tube 10 (for example, the lower-half lens tube portion when the upper half lens tube portion is removed virtually) when being viewed from the direction of the arrow D in FIG. 5.

In an example shown in FIG. 6C and FIG. 6D, the first temperature-rise suppressing mechanism 110 has a first laser beam reflection material 110C arranged on the inner circumferential surface 14a of the first lens tube 10. By arranging the first laser beam reflection material 110C on the inner circumferential surface 14a of the first lens tube 10, it is suppressed that the first laser beam is converted into heat energy in the wall 14 of the first lens tube 10. Since the conversion of the first laser beam into the heat energy in the wall 14 is suppressed, the temperature rise of the wall 14 is suppressed. As a result, the heat deformation of the first lens tube 10 is suppressed and the degradation of the optical performance of the optical system arranged in the first lens tube is suppressed.

For example, the first laser beam reflection material 110C is a laser beam reflection film. Note that a laser beam reflection coating is contained in the laser beam reflection film. For example, the laser beam reflection film is a metal film such as a gold plating film or a dielectric film such as a dielectric coating film.

Note that it is the technical common sense to form the inner circumferential surface of the lens tube, where the optical system is arranged, of a material having a high light absorption (for example, a black material) for the purpose to absorb the light (stray light and so on) which does not head for the lens which is arranged at the end of the lens tube on the laser beam emitting side. In an example shown in FIG. 6C and FIG. 6D, contrary to the technique common sense, the first laser beam reflection material 110C is arranged on the inner circumferential surface 14a of the first lens tube 10 in order to suppress the temperature rise of the wall 14 of the first lens tube 10.

When the first temperature-rise suppressing mechanism 110 has the first laser beam reflection material 110C, the heat to the wall 14 is effectively suppressed. Also, when making the first laser beam reflection material 110C function as the first temperature-rise suppressing mechanism 110, any active driving mechanism such as a pump to circulate coolant is unnecessary. Therefore, there is no case that the whole system becomes complicated due to the first laser beam reflection material 110C.

(Modification Example 2 of First Temperature-Rise Suppressing Mechanism 110)

Figure 6E:
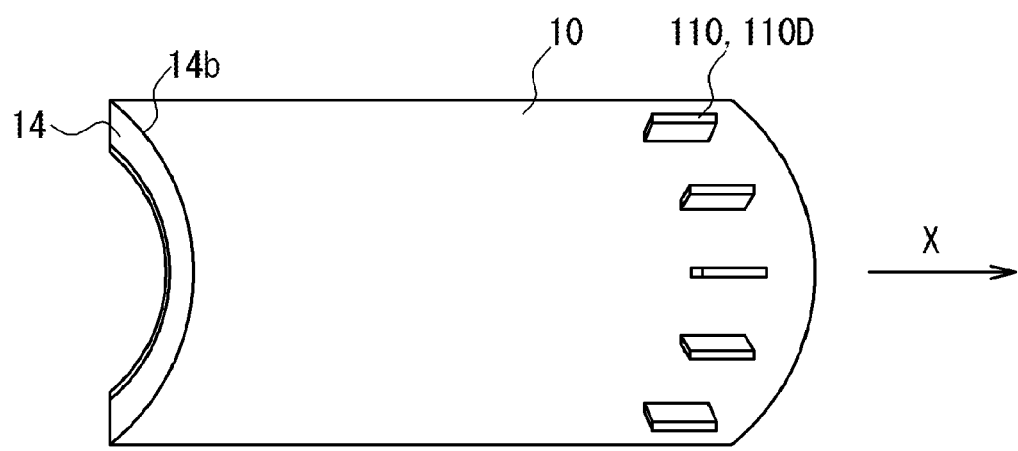
FIG. 6E is a schematic perspective view of the half lens tube portion of the first lens tube when being viewed from the direction of the arrow C in FIG. 5.
Figure 6F:
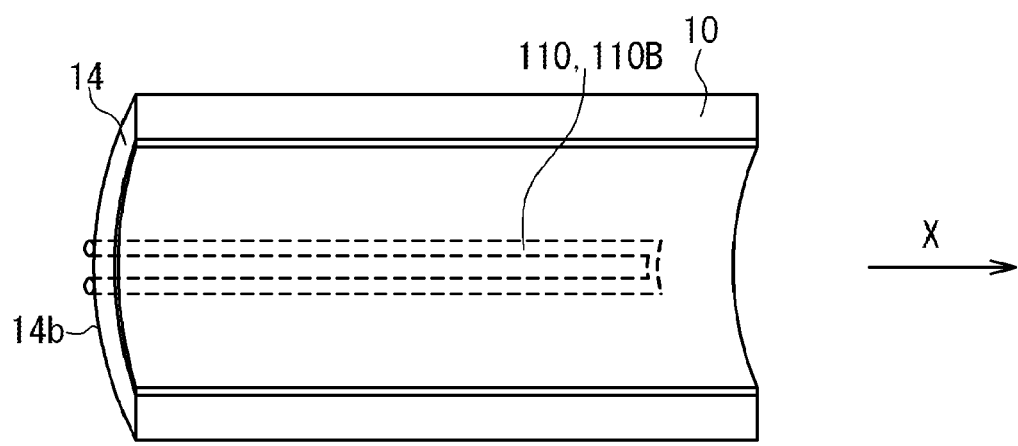
FIG. 6F is a schematic perspective view of the half lens tube portion of the first lens tube when being viewed from the direction of the arrow D in FIG. 5.

Referring to FIG. 6E and FIG. 6F, a modification example 2 of the first temperature-rise suppressing mechanism 110 will be described. FIG. 6E is a schematic perspective view of the half lens tube portion of the first lens tube 10 (for example, the upper-half lens tube portion when the lower-half lens tube portion is removed virtually) when being viewed from the direction of the arrow C in FIG. 5.

In an example shown in FIG. 6E, the first temperature-rise suppressing mechanism 110 has first heat radiation fins 110D arranged on an outer circumferential surface 14b of the first lens tube 10. The first heat radiation fins 110D radiates the heat received by the first lens tube 10 for the ambience surrounding the first lens tube 10. The wall 14 of the first lens tube 10 is cooled by the heat radiation. As a result, the thermal deformation of the first lens tube 10 is suppressed and the degradation of the optical performance of the optical system arranged in the first lens tube is suppressed.

Note that in an example shown FIG. 4 and FIG. 6E, the first heat radiation fins 110D are not provided in a part, where facing other lens tubes (the second lens tube 20 in the example shown in FIG. 4), of the outer circumferential surface of the first lens tube 10. In other words, in the example shown in FIG. 4 and FIG. 6E, the first heat radiation fins 110D are prominent for a region where the other lens tubes do not exist. Therefore, the heat radiation efficiency by the first heat radiation fins 110D is improved.

When the first temperature-rise suppressing mechanism 110 has the first heat radiation fins 110D, the heat of the wall 14 can be effectively radiated. Also, any active driving mechanism such as a pump to circulate coolant is unnecessary in order to make the first heat radiation fins 110D function as the first temperature-rise suppressing mechanism 110. Therefore, there is no case that the whole system becomes complicated because of the first heat radiation fins 110D.

(Modification Example 3 of First Temperature-Rise Suppressing Mechanism 110)

FIG. 6F is a schematic perspective view of the half lens tube portion of the first lens tube 10 when being viewed from the direction of the arrow D in FIG. 5 (for example, the lower-half lens tube portion when the upper-half lens tube portion is removed virtually).

In an example shown in FIG. 6F, the first temperature-rise suppressing mechanism 110 has a first outer coolant passage 110B. The first outer coolant passage 110B is arranged on the outer circumferential surface 14b of the first lens tube 10. The liquid coolant or gaseous coolant flows through the first outer coolant passage 110B so that the wall 14 of the first lens tube 10 is cooled. As a result, the thermal deformation of the first lens tube 10 is suppressed and the degradation of the optical performance of the optical system arranged in the first lens tube is suppressed.

Note that the first outer coolant passage 110B may be arranged (partially) in a part, where the temperature rise is large, of the outer circumferential surface of the first lens tube 10. For example, the part, where the temperature rise is large, of the outer circumferential surface of the first lens tube 10 is a part where the first lens tube 10 faces the other lens tubes.

When the first temperature-rise suppressing mechanism 110 has the first outer coolant passage 110B, a manufacturing cost can be reduced, as compared with a case where the first inner coolant passage 110A is provided. Also, when the first outer coolant passage 110B is arranged in a space between the lens tubes (for example, the space between the first lens tube and the second lens tube), the size of the laser array device 9 never increases substantively.

(Modification Example 4 of First Temperature-Rise Suppressing Mechanism 110)

Figure 6G:
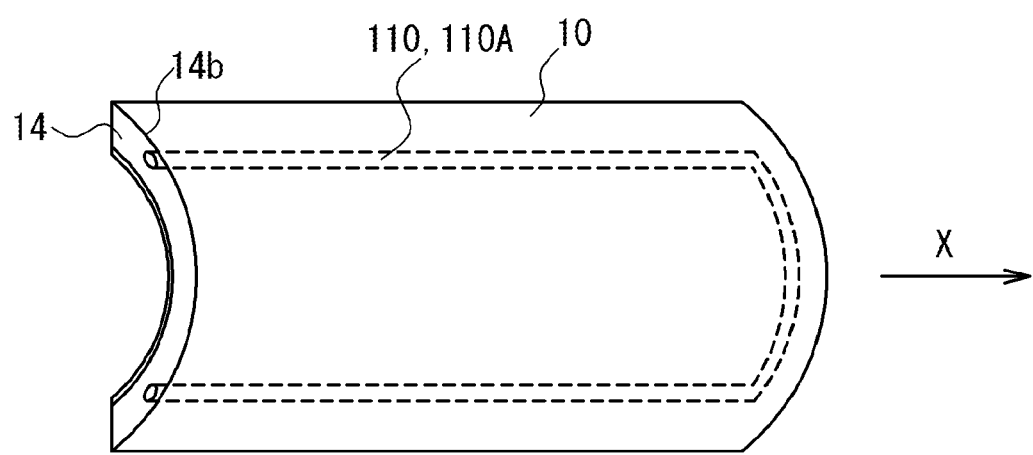
FIG. 6G is a schematic perspective view of the half lens tube portion of the first lens tube when being viewed from the direction of the arrow C in FIG. 5.
Figure 6H:
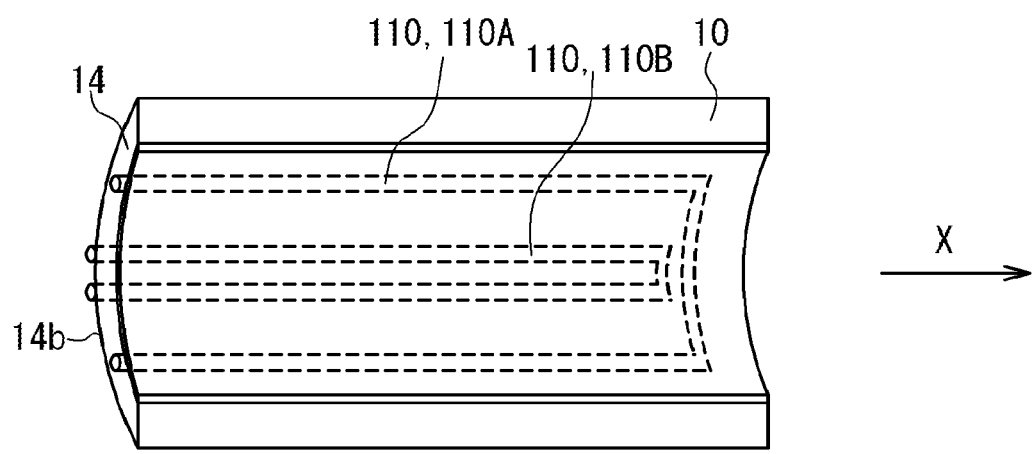
FIG. 6H is a schematic perspective view of the remaining half lens tube portion of the first lens tube when being viewed from the direction of arrow D in FIG. 5.

The first temperature-rise suppressing mechanism 110 may have any two (for example, only two) of the first inner coolant passage 110A, the first outer coolant passage 110B, the first laser beam reflection material 110C, and the first heat radiation fins 110D. For example, as shown in FIG. 6G and FIG. 6H, when the first temperature-rise suppressing mechanism 110 has the first inner coolant passage 110A and the first outer coolant passage 110B, the cooling of the wall 14 is enhanced.

Alternatively, the first temperature-rise suppressing mechanism 110 may have the first laser beam reflection material 110C and the other temperature-rise suppressing mechanism (e.g. the coolant passage, the radiation fin and so on). The upper limit of the reflectivity of the laser beam in the first laser beam reflection material 110C is, for example, 99.0% or 99.9%. Therefore, a part of the laser beam which is incident on the first laser beam reflection material 110C is not reflected but is used to raise the temperature of the wall 14. When the first laser beam reflection material and the other first temperature-rise suppressing mechanism are used, the temperature-rise due to the laser beam absorbed by the first laser beam reflection material 110C or the wall 14 is effectively suppressed.

Figure 6I:
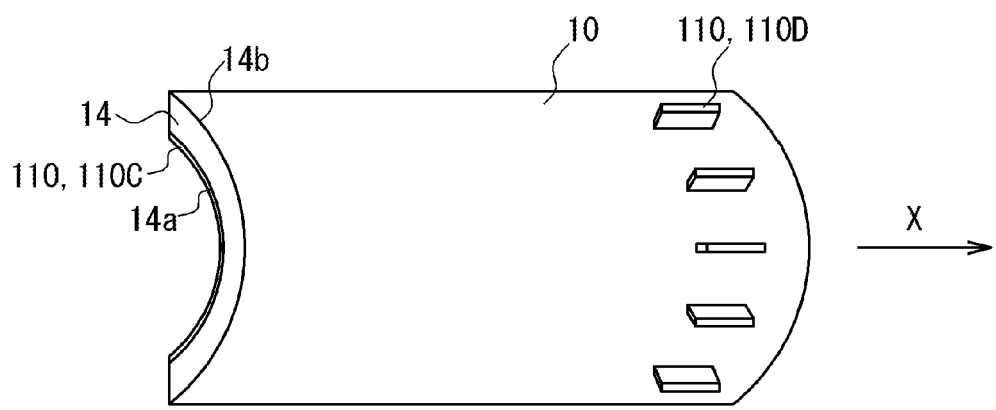
FIG. 6I is a schematic perspective view of the half lens tube portion of the first lens tube when being viewed from the direction of arrow C in FIG. 5.
Figure 6J:
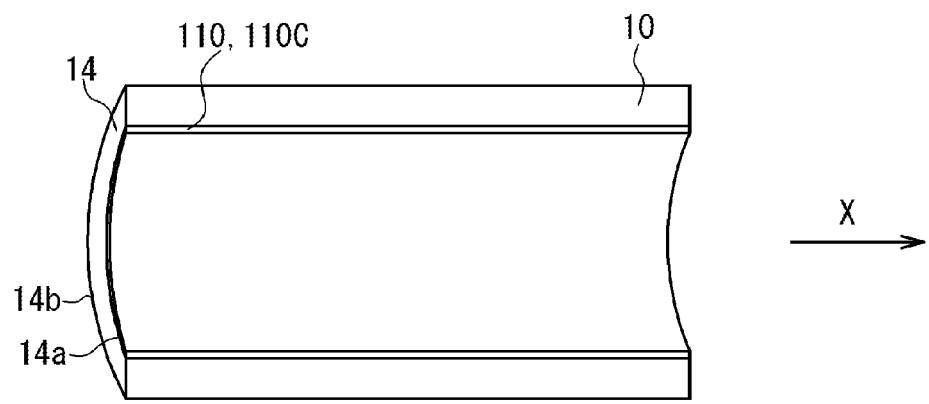
FIG. 6J are a schematic perspective view. It saw from the direction where the half lens tube portion of the remainder in the first lens tube of arrow D in FIG. 5.

For example, as shown in FIG. 6I and FIG. 6J, the first temperature-rise suppressing mechanism 110 may have the first laser beam reflection material 110C and the first heat radiation fins 110D (or, the first laser beam reflection material 110C and only the first heat radiation fin 110D). When the first temperature-rise suppressing mechanism 110 has the first laser beam reflection material 110C and the first heat radiation fin 110D, it is possible to enhance the temperature-rise suppressing function without providing any active driving mechanism such as a pump to circulate the coolant.

Note that the arrangement of the first heat radiation fin 110D can be comparatively freely designed. Therefore, it is possible to adopt either of the first inner coolant passage 110A, the first outer coolant passage 110B and the first laser beam reflection material 110C as a basic one of the temperature-rise suppressing mechanism, and to arrange the first heat radiation fin 110D in a part of the first lens tube 10 where the temperature rise is locally large (for example, the end of of the first lens tube on the laser beam emitting side). The first heat radiation fin 110D may be arranged only in the part of the first lens tube 10 where the temperature rise is locally large (for example, only the end of the first lens tube on the laser beam emitting side).

The arrangement of the first outer coolant passage 110B can be comparatively freely designed. Therefore, the temperature-rise suppressing mechanism may adopt either the first inner coolant passage 110A or the first laser beam reflection material 110C as the basic one of the temperature-rise suppressing mechanism, and arrange the first outer coolant passage 110B in the part of the first lens tube 10 where the temperature rise is locally large (for example, the part of the first lens tube on the laser beam emitting side or the part of the first lens tube 10 which faces the second lens tube 20). The first outer coolant passage 110B may be arranged only in the part of the first lens tube 10 where the temperature rise is locally large (for example, only the part of the first lens tube 10 which faces the second lens tube 20).
(Modification Example 5 of First Temperature-Rise Suppressing Mechanism 110)

Alternatively, the first temperature-rise suppressing mechanism 110 may have at least three (for example, only three) of the first inner coolant passage 110A, the first outer coolant passage 110B, the first laser beam reflection material 110C, and the first heat radiation fin 110D.

Figure 6K:
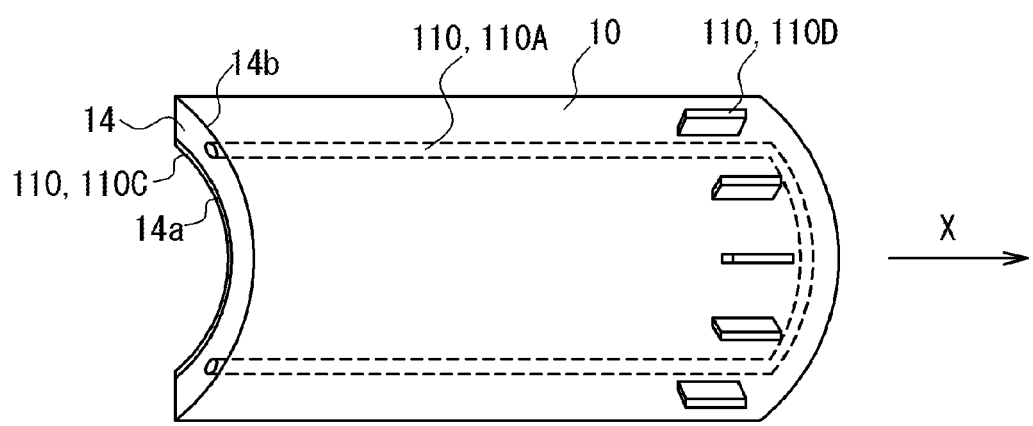
FIG. 6K is a schematic perspective view of the half lens tube portion of the first lens tube when being viewed from the direction of the arrow C in FIG. 5.
Figure 6L:
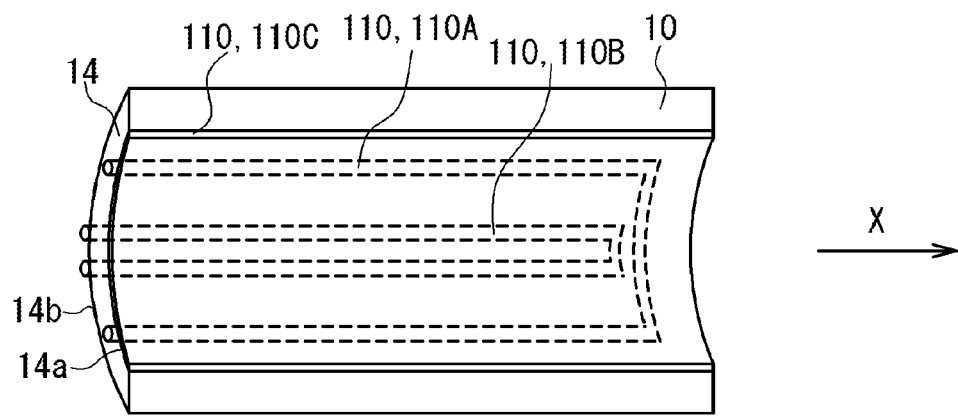
FIG. 6L is a schematic perspective view of the remaining half lens tube portion of the first lens tube when being viewed from the direction of the arrow D in FIG. 5.
Figure 6M:
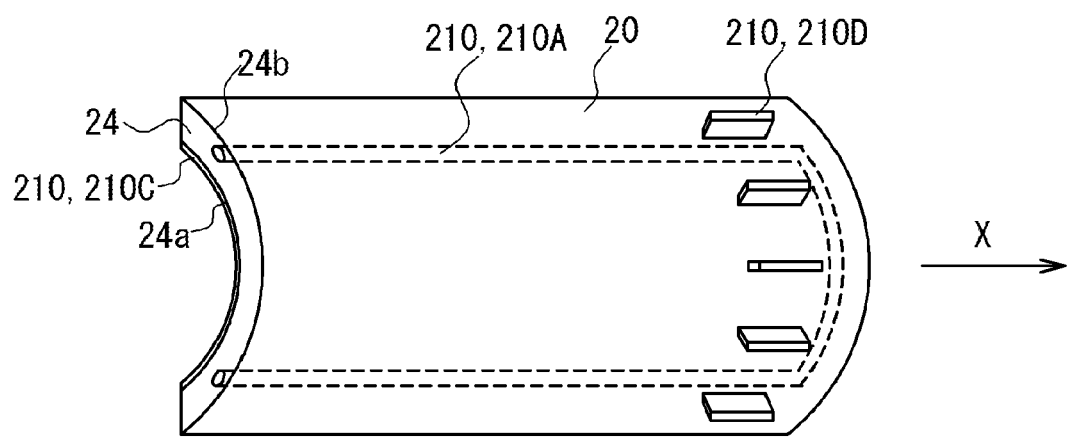
FIG. 6M is a schematic perspective view of a half lens tube portion of a second lens tube when being viewed from the direction of an arrow E in FIG. 5.
Figure 6N:
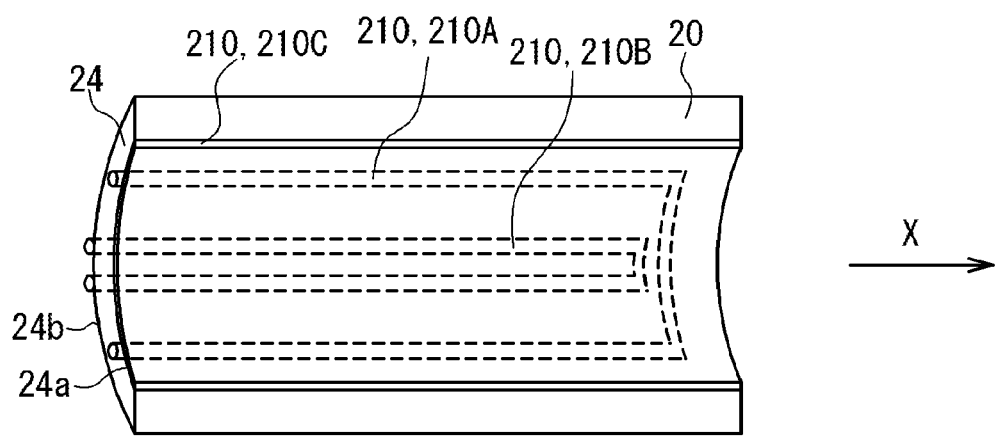
FIG. 6N is a schematic perspective view of the remaining half lens tube portion of the second lens tube when being viewed from the direction of an arrow F in FIG. 5.

For example, in an example shown in FIG. 6K and FIG. 6L, the first temperature-rise suppressing mechanism 110 has the first inner coolant passage 110A, the first outer coolant passage 110B, the first laser beam reflection material 110C and the first heat radiation fin 110D. In the example shown in FIG. 6K and FIG. 6L, the suppressing of the temperature rise by the first temperature-rise suppressing mechanism is most effectively carried out.

Note that in this Specification, the first inner coolant passage 110A, the first outer coolant passage 110B, the first laser beam reflection material 110C, and the first heat radiation fin 110D are respectively defined as the temperature-rise suppressing mechanism of an inner coolant type (the temperature-rise suppressing mechanism of a first kind or first type), the temperature-rise suppressing mechanism of an outer coolant type (the temperature-rise suppressing mechanism of a second kind or second type), the temperature-rise suppressing mechanism of a heat input suppressing type (the temperature-rise suppressing mechanism of a third kind or third type), and the temperature-rise suppressing mechanism of a heat radiation type (the temperature-rise suppressing mechanism of a fourth kind or fourth type).

The temperature-rise suppressing mechanism of the first kind, the temperature-rise suppressing mechanism of the second kind, the temperature-rise suppressing mechanism of the third kind, and the temperature-rise suppressing mechanism of the fourth kind are the temperature-rise suppressing mechanisms of kinds different from each other (of different types from each other). For example, it is assumed that the first lens tube 10 is arranged to be surrounded by a plurality of lens tubes. In such a case, there is a possibility that the temperature-rise of the first lens tube 10 becomes large. Therefore, in such a case, the temperature-rise suppressing mechanisms of the plurality of types (at least two types, at least three types, or at least four types) may be arranged in the first lens tube 10.

(Second Temperature-Rise Suppressing Mechanism 210)

Next, an example of a second temperature-rise suppressing mechanism 210 is shown in FIG. 6M and FIG. 6N. FIG. 6M is a schematic perspective view of a half lens tube portion of the second lens tube 20 when being viewed from the direction of an arrow E in FIG. 5 (for example, a lower-half lens tube portion when an upper-half lens tube portion is removed virtually). FIG. 6N is a schematic perspective view of the remaining half lens tube portion of the second lens tube 20 when being viewed from the direction of an arrow F in FIG. 5 (for example, the upper-half lens tube portion when the lower-half lens tube portion is removed virtually).

A second temperature-rise suppressing mechanism 210 is a mechanism which is arranged in the second lens tube 20 to suppress the temperature rise of the second lens tube 20. The second temperature-rise suppressing mechanism 210 has the same configuration as the first temperature-rise suppressing mechanism 110. The second temperature-rise suppressing mechanisms 210 shown in FIG. 6M and FIG. 6N are the same as the first temperature-rise suppressing mechanisms 110 shown in FIG. 6K and FIG. 6L. Alternatively, the second temperature-rise suppressing mechanism 210 may be the same as the first temperature-rise suppressing mechanism 110 shown in any one of FIG. 6A to FIG. 6J. The repetitive description of the second temperature-rise suppressing mechanism 210 is omitted.

Note that regarding the description of the first temperature-rise suppressing mechanism 110 and FIG. 6A or FIG. 6L, if "the first lens tube 10", "the first temperature-rise suppressing mechanism 110", "the first inner coolant passage 110A", "the first outer coolant passage 110B", "the first laser beam reflection material 110C", "the first heat radiation fin 110D", "the wall 14", "the inner circumferential surface 14a", "the outer circumferential surface 14b", "the first laser beam", and "the second lens tube 20" shall read "the second lens tube 20", "the second temperature-rise suppressing mechanism 210", "the second inner coolant passage 210A", "the second outer coolant passage 210B", "the second laser beam reflection material 210C", "the second radiation fin 210D", "the wall 24", "the inner circumferential surface 24a", "the outer circumferential surface 24b", "the second laser beam", and "the first lens tube 10", the description of the second temperature-rise suppressing mechanism 210 is presented. For example, the second temperature-rise suppressing mechanism 210 has at least one of the second inner coolant passage 210A, the second outer coolant passage 210B, the second laser beam reflection material 210C and the second heat radiation fin 210D. Note that when the temperature rise of the second lens tube 20 is small, it is not necessary to provide the second temperature-rise suppressing mechanism 210 for the second lens tube 20 (in other words, the temperature-rise suppressing mechanism may be provided for only the lens tube in which it is assumed that the temperature rise becomes large (for example, the first lens tube).

In an example shown in FIG. 4 to FIG. 6N, the temperature rise of each lens tube is suppressed. As a result, the optical performance of the optical system arranged in each lens tube is prevented from being degraded due to the temperature rise of each lens tube. Also, in the example shown in FIG. 4 to FIG. 6N, the temperature rise of each lens tube is suppressed. Therefore, it becomes possible to densely collect the lens tubes, i.e. a plurality of laser beams. As a result, the optical characteristics of a synthetic laser beam which is formed by superimposing a plurality of laser beams are improved (if necessary, refer to FIG. 3). An interval between the first lens tube 10 and the second lens tube 20 is possible to be, for example, between 0 mm and 75 mm, between 0 mm and 50 mm, between 0 mm and 30 mm, or between 0 mm and 20 mm.

(More Detailed Explanation of Laser Array Device)

Figure 7:
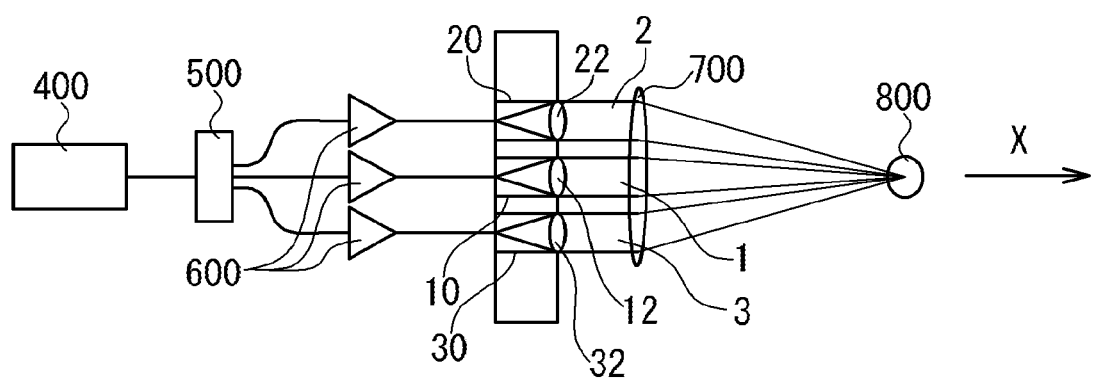
FIG. 7 is a functional block diagram schematically showing a laser irradiation system containing a laser array device.
Figure 8:
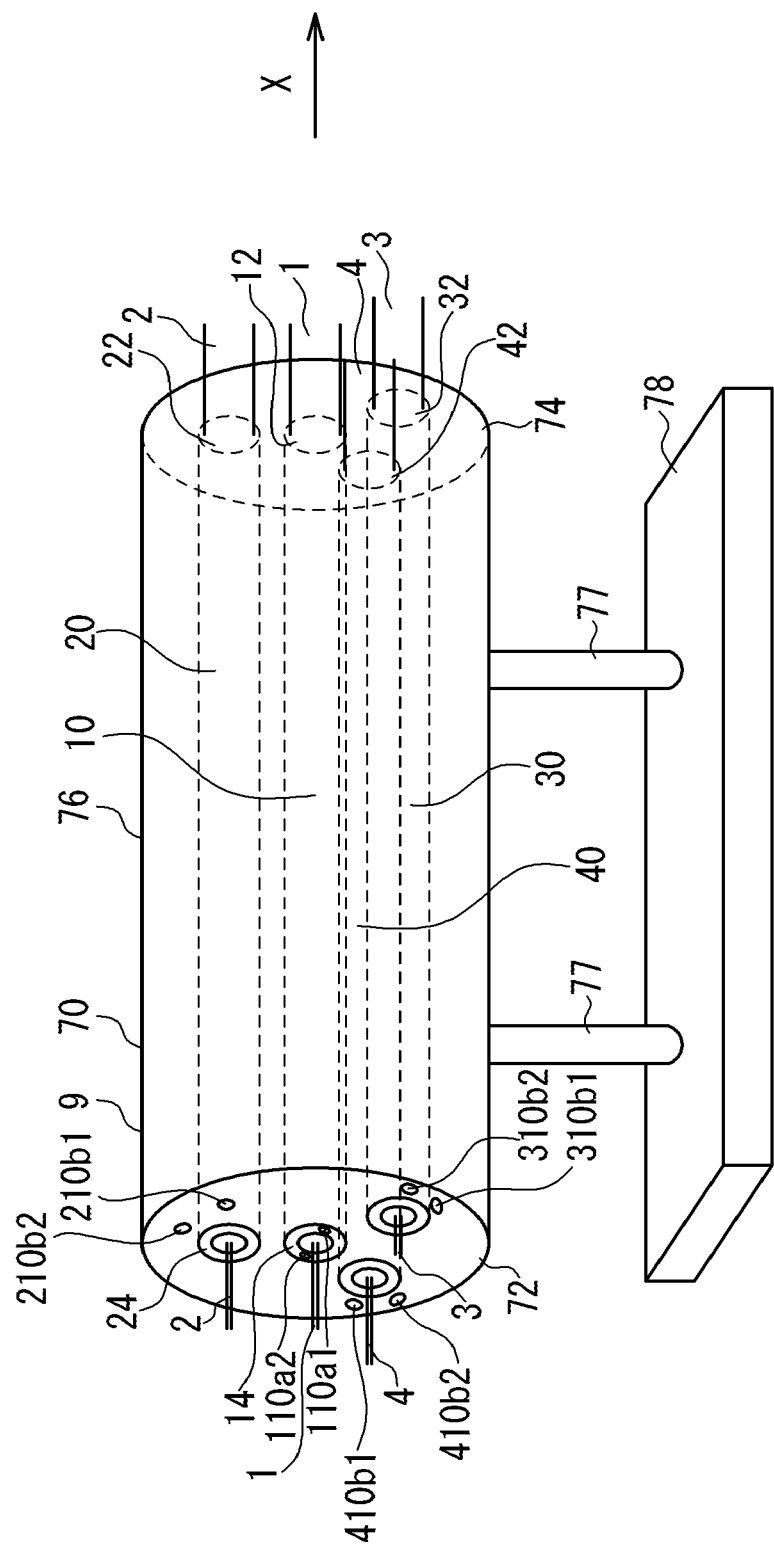
FIG. 8 is a schematic perspective view showing an example of configuration of the laser array device.
Figure 9:
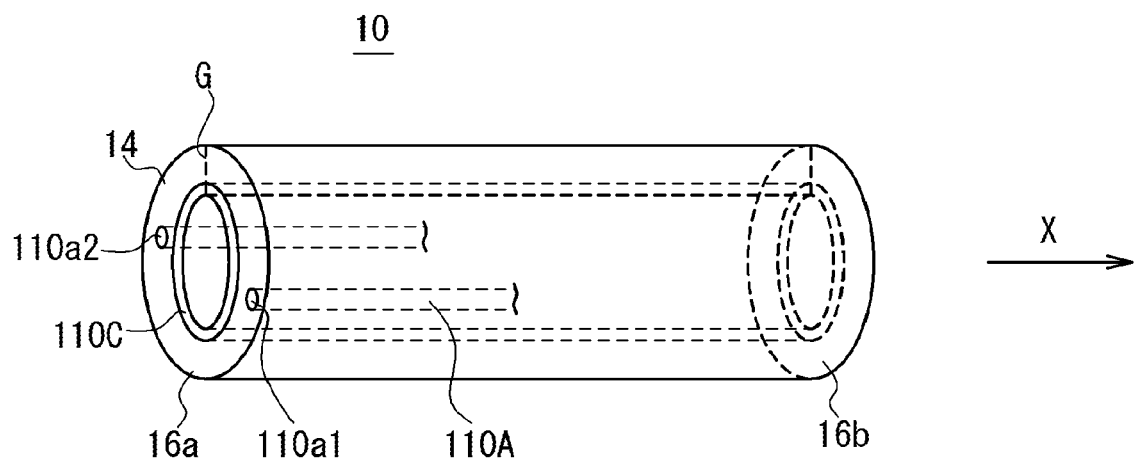
FIG. 9 is a schematic perspective view showing an example of configuration of the first lens tube.
Figure 10:
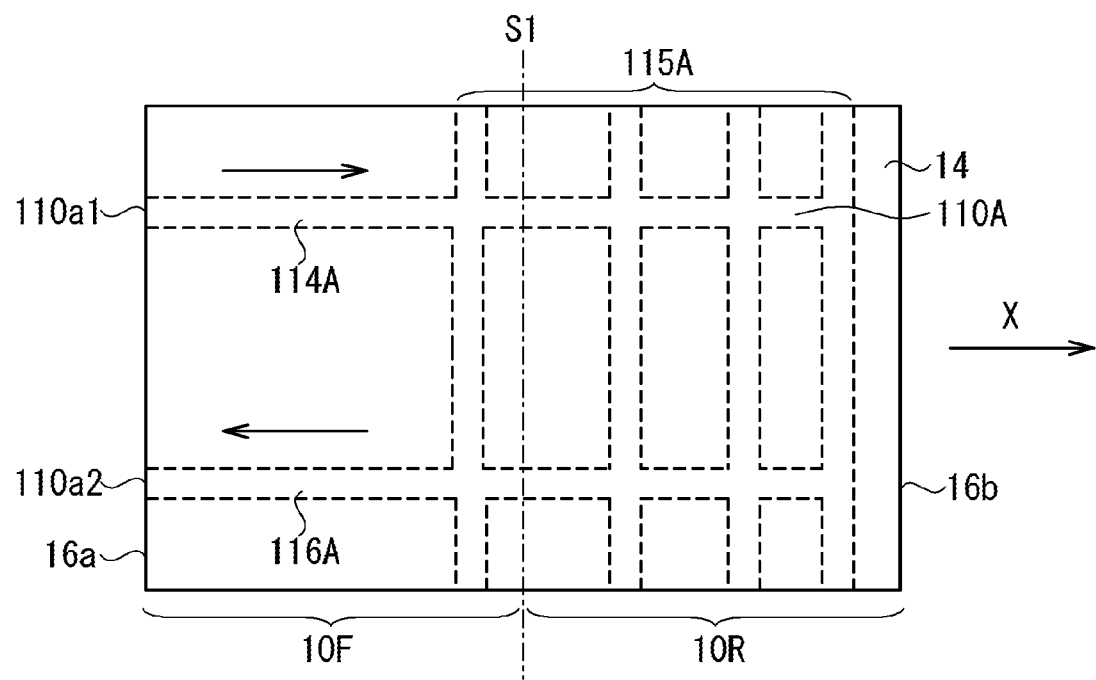
FIG. 10 is a development view of the first lens tube shown in FIG. 9.
Figure 11:
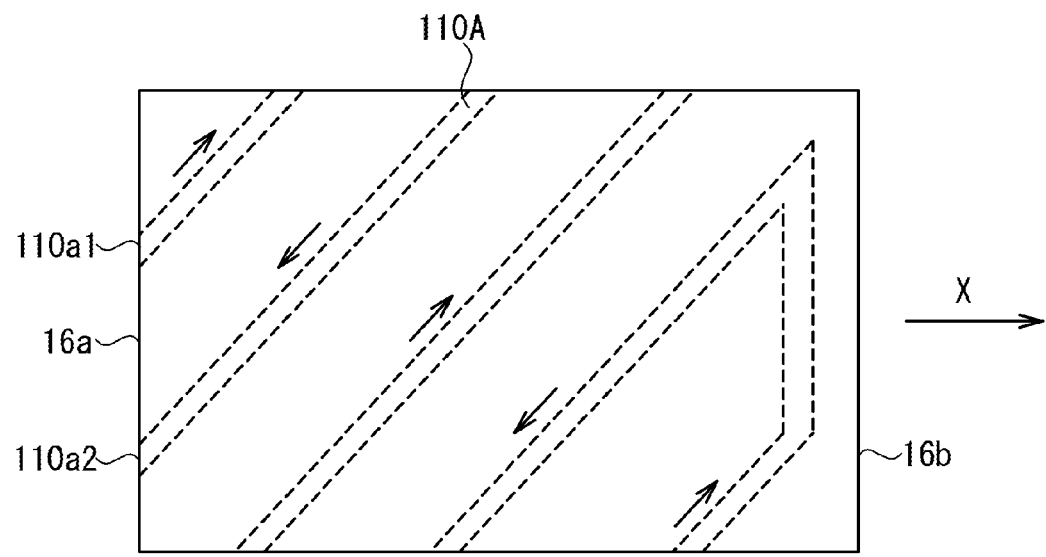
FIG. 11 is a development view of the first lens tube shown in FIG. 9.
Figure 12:
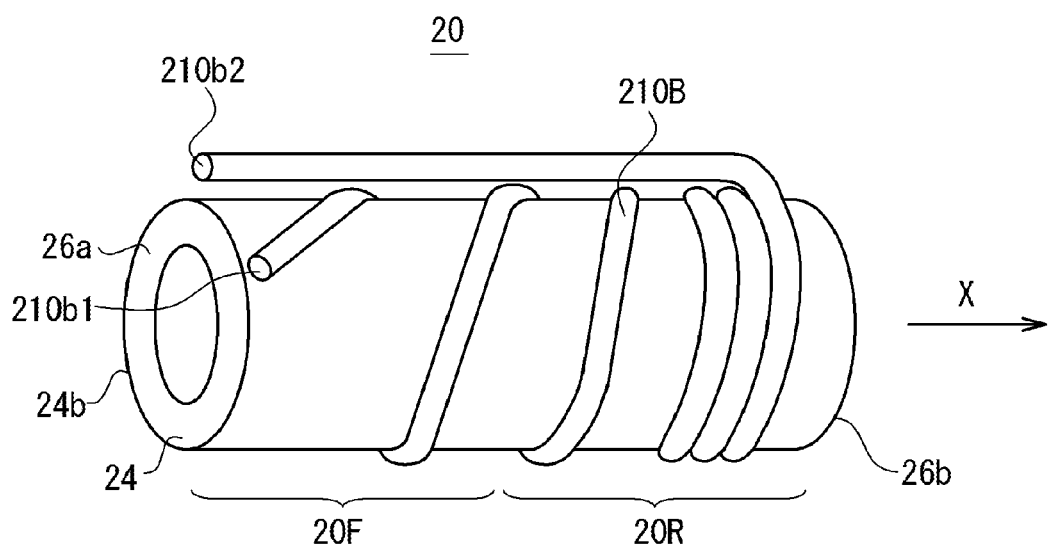
FIG. 12 is a schematic perspective view showing an example of configuration of the second lens tube.

Referring to FIG. 7 or FIG. 12, the laser array device 9 will be described in detail. FIG. 7 is a functional block diagram schematically showing a laser irradiation system 1000 which contains the laser array device 9. FIG. 8 is a schematic perspective view showing an example of the configuration of the laser array device 9. FIG. 9 is a schematic perspective view showing an example of the configuration of the first lens tube 10. FIG. 10 is a development view of the first lens tube 10 shown in FIG. 9. FIG. 11 is a development view of the first lens tube 10 shown in FIG. 9. FIG. 12 is a schematic perspective view showing an example of the configuration of the second lens tube 20. The members in FIG. 7 to FIG. 12 having the same functions as the members shown in FIG. 4 to FIG. 6D are assigned with the same reference numerals. The description of the members assigned with the same reference numerals is omitted.

(Laser Irradiation System)

The laser array device 9 is a device which configures a part of the laser irradiation system 1000. The laser irradiation system 1000 includes a laser beam source 400, a laser beam splitter 500, laser beam amplifiers 600, and a condensing lens 700 in addition to the laser array device 9.

The laser beam source 400 generates a laser beam as a species light. The laser beam splitter 500 receives the laser beam from the laser beam source 400 and splits the received laser beam into a plurality of laser beams. Note that the transmission of the laser beam between the laser beam source 400 and the laser beam splitter 500 may be carried out through an optical fiber (in other words, the optical fiber may be arranged between the laser beam source 400 and the laser beam splitter 500).

Each of the laser beam amplifiers 600 amplifies a corresponding one of the laser beams split by the laser beam splitter 500. The laser beam amplifier 600 may be a device which amplifies the laser beam by passing the laser beam through a laser gain medium (solid or liquid laser gain medium). Note that the transmission of the laser beam between the laser beam splitter 500 and each of the laser beam amplifiers 600 may be carried out through an optical fiber (in other words, the optical fiber may be arranged between the laser beam splitter 500 and each laser beam amplifier 600). Also, to phase shifter (not shown) may be arranged between the laser beam splitter 500 and each laser beam amplifier 600 to shift the phase of the laser beam.

The laser beam amplified by the laser beam amplifier is introduced into the laser array device 9. For example, the laser beam amplified by a first laser beam amplifier (a first laser beam) may be introduced into the first lens tube 10 of the laser array device 9, the laser beam amplified by a second laser beam amplifier (a second laser beam) may be introduced into the second lens tube 20 of the laser array device 9, the laser beam amplified by a third laser beam amplifier (a third laser beam 3) may be introduced into a third lens tube 30 of the laser array device 9, and the laser beam amplified by a fourth laser beam amplifier (a fourth laser beam 4) may be introduced into the fourth lens tube 40 of the laser array device (note that the fourth laser beam amplifier and the fourth lens tube 40 are not shown in FIG. 7). Note that the transmission of the laser beam between each laser beam amplifier 600 and the laser array device 9 may be carried out through an optical fiber (in other words, the optical fiber may be arranged between each laser beam amplifier 600 and the corresponding lens tube).

The condensing lens 700 are focused the laser beams (the first laser beam 1, the second laser beam 2, and so on) received from the laser array device 9 for a target 800. Note that in an example shown in FIG. 7, an optical fiber is not arranged between the laser array device 9 and the condensing lens 700 and between the laser array device 9 and the target 800. In the example shown in FIG. 7, the laser irradiation system 1000 has the condensing lens 700. Alternatively, by giving the function of the condensing lens 700 to the laser array device 9, the condensing lens 700 arranged in the +X direction from the laser array device 9 may be omitted. The first lens 12 (for example, a lens arranged on the first laser beam emitting side from the laser array device 9) and the second lens 22 (a lens arranged on the second laser beam emitting side from the laser array device 9) may have a function to collect the first laser beam 1 and the second laser beam 2 for the target 800.

FIG. 8 is a schematic perspective view showing an example of the configuration of the laser array device 9. The laser array device 9 includes the first lens tube 10, the second lens tube 20, the third lens tube 30, the fourth lens tube 40, a support mechanism (72, 74) to support the first lens tube 10 to the fourth lens tube 40, the first lens 12 arranged in the first lens tube 10, the second lens 22 arranged in the second lens tube 20, the third lens 32 arranged in the third lens tube 30, the fourth lens 42 arranged in the fourth lens tube 40, and the temperature-rise suppressing mechanism arranged for every lens tube (the first temperature-rise suppressing mechanism arranged in the first lens tube, the second temperature-rise suppressing mechanism arranged in the second lens tube, a third temperature-rise suppressing mechanism arranged in the third lens tube, and a fourth temperature-rise suppressing mechanism arranged in the fourth lens tube).

(Lens Tube)

In an example shown in FIG. 8, the laser array device 9 has the first lens tube 10, the second lens tube 20, the third lens tube 30 and the fourth lens tube 40. In other words, in the example shown in FIG. 8, the laser array device 9 has four lens tubes. Alternatively, the laser array device may have one lens tube, two lens tubes, three lens tubes or five or more lens tubes. The material of the lens tube is, for example, metal. For example, the thickness of the wall 14 of the lens tube is from 5 mm or more to 10 mm or less.

In the example shown in FIG. 8, the first laser beam 1 of the plurality of laser beams passes through the first lens tube 10, the second laser beam 2 thereof passes through the second lens tube 20, the third laser beam 3 thereof passes through the third lens tube 30 and the fourth laser beam 4 thereof passes through the fourth lens tube 40.

In the example shown in FIG. 8, the first lens tube 10 is surrounded by the other lens tubes (20, 30, and 40). Note that the fact that one lens tube is "surrounded" by other lens tubes means that the center of the one lens tube is located inside a diagram formed by linking the centers of the other lens tubes (for example, a triangle diagram when the other lens tubes are three) in the cross-section perpendicular to the longitudinal direction (the X axis) of one lens tube.

(Support Mechanism)

The support mechanism (72, 74) supports the first lens tube 10 and the second lens tube 20 such that the first lens tube 10 and the second lens tube 20 are parallel to each other. The support mechanism (72, 74) supports a plurality of lens tubes such that the plurality of lens tubes are parallel to each other. The support mechanism (72, 74) may be a first end wall 72 of a housing 70 which surrounds the plurality of lens tubes (an end wall on the side on which the first laser beam is incident) and a second end wall 74 of of the housing 70

(an end wall on the side from which the first laser beam is emitted). The housing 70 may be supported by a base member (76, 78).

The housing 70 may be supported by the base member to be movable or rotatable to the base member (76, 78) (for example, to be rotatable and movable so as to change a direction shown by the longitudinal direction of the first lens tube 10). Alternatively, the housing 70 may be fixed to the base member not so as to move. In the example shown in FIG. 8, the base member contains a base board 78 and support columns 77 arranged between the base plate 78 and the housing 70.

The housing 70 may have a pipe-shaped side wall 76 arranged between the first end wall 72 and the second end wall 74. Also, the space in the housing 70 may be a closed space which is surrounded by the first end wall 72, the second end wall 74 and the side wall 76.

Note that in FIG. 8, a second coolant input port 210b1 provided in the first end wall 72 is a port to supply the coolant to the second coolant passage to be described later. In the same way, a third coolant input port 310b1 provided in the first end wall 72 and a fourth coolant input port 410b1 are ports to supply the coolant to the third coolant passage and the fourth coolant passage to be described later. Also, in FIG. 8, a second coolant output port 210b2 provided in the first end wall 72 is a port to discharge the coolant from the second coolant passage. In the same way, a third coolant output port 310b2 and a fourth coolant output port 410b2 provided in the first end wall 72 are ports to discharge the coolant from the third coolant passage and the fourth coolant passage. For example, note that the coolant is water. For example, the coolant circulates in the circulation passage which contains the first coolant passage to the fourth coolant passage by a pump (not shown).

Note that in the example shown in FIG. 8, the first coolant input port 110a1 provided in the end of the first lens tube 10 (more specifically, the end surface or end section on the side of the first laser beam incidence) is a port to supply the coolant to the first coolant passage. Also, the first coolant output port 110a2 provided in the end of the first lens tube 10 (more specifically, the end surface or end section on the side of the first laser beam incidence) is a port to discharge the coolant from the first coolant passage. Alternatively, the first coolant input port 110a1 and the first coolant output port 110a2 may be provided in the first end wall 72.

In the example shown in FIG. 8, the coolant input ports (110a1, 210b1, 310b1, 410b1 and so on) and the coolant output ports (110a2, 210b2, 310b2, 410b2) are arranged in the first end wall 72 which is the end wall on the the laser beam incident side or in the end section on the laser beam incidence side of the first lens tube 10. Therefore, a connection work between the coolant passage and an external pipe (not shown) can be efficiently carried out. Also, in the example shown in FIG. 8, the coolant input port and the coolant output port are not arranged in the second end wall 74 which is the end wall on the laser beam emitting side. For this reason, the damage to each of the ports and the external pipes connected with the ports by the laser beam emitted from the first lens 12 to the fourth lens and so on can be suppressed. Also, although the the first lens 12 to the fourth lens 42 are supported indirectly by the second end wall 74, the position shift of the first lens 12 to the fourth lens 42 through the connecting work between the coolant passages and the external pipes is suppressed.
(Optical Element Arranged in Lens Tube)

At least one optical element (e.g. the first lens 12) is arranged inside the first lens tube 10, at least one optical element (e.g. the second lens 22) is arranged inside the second lens tube 20, at least one optical element (e.g. the third lens 32) is arranged inside the third lens tube 30, and at least one optical element (e.g. the fourth lens 42) is arranged inside the fourth lens tube 40.
(First Lens Tube and First Temperature-Rise Suppressing Mechanism)

Referring to FIG. 9 to FIG. 10, the first lens tube 10 and the first temperature-rise suppressing mechanism 110 will be described. FIG. 9 is a schematic perspective view showing the first lens tube 10. FIG. 10 is a development view of the first lens tube 10. More specifically, FIG. 10 is a development view when the first lens tube 10 is virtually cut in a plane G in FIG. 9 and the cut first lens tube 10 is virtually developed.

In an example shown in FIG. 9, the first lens tube 10 has the first inner coolant passage 110A which is arranged inside the end wall 14 of the first lens tube as the first temperature-rise suppressing mechanism 110. The first inner coolant passage 110A is connected with the first coolant input port 110a1 and the first coolant output port 110a2. The first coolant input port 110a1 and the first coolant output port 110a2 are arranged on the end surface 16a on the first laser beam incidence side of the first lens tube 10.

In the example shown in FIG. 9, the first lens tube 10 has the first laser beam reflection material 110C as the first temperature-rise suppressing mechanism 110. The first laser beam reflection material 110C is arranged on the inner circumferential surface of the first lens tube 10. The first laser beam reflection material 110C may be arranged in the whole of inner circumferential surface of the first lens tube 10. Alternatively, when the spot diameter of the first laser beam expands toward the end surface 16b of the first lens tube 10 on the first laser beam emitting side, the first laser beam reflection material 110C may be arranged on (only) the inner circumferential surface of the rear section 10R of the first lens tube 10. Here, as grasped from FIG. 10, the rear section 10R of the first lens tube 10 is defined as a half of the first lens tube 10 on the first laser beam emitting side (for example, a rear half part on the side of the end surface 16b from an intermediate plane S1 between the end surface 16a and the end surface 16b). A front section 10F of the first lens tube 10 is defined as a half of the first lens tube 10 on the first laser beam incidence side (for example, a front half portion on the side of the end surface 16a from the intermediate plane S1 between the end surface 16a and the end surface 16b).

In an example shown in FIG. 10, a first coolant passage (the first inner coolant passage 110A) is more densely arranged in the rear section 10R of the first lens tube than the front section 10F of the first lens tube. In other words, in the example shown in FIG. 10, a total heat exchange area between the first coolant passage in the rear section 10R of the first lens tube and the wall 14 of the first lens tube is wider than the total heat exchange area between the first coolant passage in the front section 10F of the first lens tube and the wall 14 of the first lens tube.

For this reason, the cooling effect in the rear section 10R of the first lens tube is larger than the cooling effect in the front section 10F of the first lens tube. Therefore, the example shown in FIG. 10 is suitable when the spot diameter of the first laser beam expands toward the end surface 16b on the first laser beam emitting side of the first lens tube 10 (that is, when a heat input quantity to the wall 14 from the first laser beam increases toward the end surface 16b on the emitting side). Note that the first inner coolant passage 110A may include at least one input side passage 114A, at least one output side passage 116A, and a plurality of branch passages 115A which fluid connect between the input side passage and the output side passage 116A.

The first lens tube 10 is a lens tube surrounded by other lens tubes (referring to FIG. 8, if necessary). Therefore, a heat radiation quantity to the periphery of the first lens tube 10 from the first lens tube 10 is relatively small and the heat input quantity to the first lens tube 10 from the periphery of the first lens tube 10 is relatively large. When the first lens tube 10 is a lens tube surrounded by the other lens tubes, it is desirable that the first temperature-rise suppressing mechanism is more powerful, as compared with a case that the first lens tube is not a lens tube surrounded by the other lens tubes. When the inner coolant passage is arranged in the first lens tube 10, it is possible to make the first temperature-rise suppressing mechanism more powerful, compared with a case that an outer coolant passage is arranged.

Also, in the examples shown in FIG. 9 and FIG. 10, both of the first inner coolant passage 110A and the first laser beam reflection material 110C are used as the first temperature-rise suppressing mechanism. Therefore, the first temperature-rise suppressing mechanism can be made more powerful.

Note that in the example shown in FIG. 9 and FIG. 10, either of the first inner coolant passage 110A or the first laser beam reflection material 110C may be omitted. Alternatively or additionally, the first inner coolant passage 110A may be substituted by the first outer coolant passage arranged on the outer circumferential surface of the first lens tube 10.

FIG. 11 shows a modification example of the first inner coolant passage 110A. FIG. 11 is a development view of the first lens tube 10. More specifically, FIG. 11 is a development view obtained by virtually cutting the first lens tube 10 by the plane G in FIG. 9, and virtually developing the cut first lens tube 10 on the plane.

An example shown in FIG. 11 differs from the example shown in FIG. 10 in that the first inner coolant passage 110A is arranged spirally.

Note that the first temperature-rise suppressing mechanism arranged in the first lens tube 10 may include a temperature-rise suppressing mechanism of a type different from the second temperature-rise suppressing mechanism arranged in the second lens tube (note that the second lens tube is one of the plurality lens tubes arranged to surround the first lens tube 10, for example). It becomes possible to realize the temperature control suitable for each lens tube, when the first lens tube 10 includes the temperature-rise suppressing mechanism of the type different from the second temperature-rise suppressing mechanism.

(Second Lens Tube and Second Temperature-Rise Suppressing Mechanism)

Referring to FIG. 12, the second lens tube 20 and the second temperature-rise suppressing mechanism 210 will be described. FIG. 12 is a schematic perspective view showing the second lens tube 20.

In the example shown in FIG. 12, the second lens tube 20 is provided with the second outer coolant passage 210B arranged on an outer circumferential surface 24b of the second lens tube as the second temperature-rise suppressing mechanism 210. The second outer coolant passage 210B is connected with a second coolant input port 210b1 and a second coolant output port 210b2.

In the example shown in FIG. 12, the second coolant passage (the second outer coolant passage 210B) is arranged more densely than the front section 20F of the second lens tube (for example, the front half portion on the side of end surface 26b from an intermediate plane between the end surface 26a and the end surface 26b) of the rear section 20R of the second lens tube (for example, a rear section on the side of the end surface 26a from the intermediate plane between the end surface 26a and the end surface 26b). In other words, in the example shown in FIG. 12, a total heat exchange area between the second coolant passage in the rear section 20R of the second lens tube and the wall 24 of the second lens tube is wider than a total heat exchange area between the second coolant passage in the front section 20F of the second lens tube and the wall 24 of the second lens tube.

Therefore, the cooling effect in the rear section 20R of the second lens tube is larger than the cooling effect in the front section 20F of the second lens tube. Therefore, the example shown in FIG. 12 is suitable when the spot diameter of the second laser beam expands toward the end surface 26b on the side of the second laser beam emitting side of the second lens tube 20 (that is, when the heat input quantity to the wall 24 from the second laser beam increases toward the end surface 26b on the emitting side).

In the example shown in FIG. 12, the second outer coolant passage is a spiral passage. Therefore, the cooling efficiency of the wall 24 of the second lens tube 20 by the second outer coolant passage 210B is high.

The second lens tube 20 is a lens tube which is not surrounded by the other lens tubes (referring to FIG. 8, if necessary). Therefore, a heat radiation quantity to the periphery of the second lens tube 20 from the second lens tube 20 is relatively large. Also, a heat input quantity from the periphery of the second lens tube 20 to the second lens tube 20 is relatively small. Therefore, in the example shown in FIG. 12, as the second temperature-rise suppressing mechanism, an outer coolant passage is used which is lower in the cooling efficiency than the inner coolant passage.

The second lens tube 20 is a lens tube which is not surrounded by other lens tubes. Therefore, as the second temperature-rise suppressing mechanism 210, a second heat radiation fin may be adopted in addition to the second outer coolant passage 210B or in place of the second outer coolant passage 210B. It is desirable that the second heat radiation fin is arranged to be prominent for the region where the other lens tubes do not exist.

Alternatively or additionally, one of the second inner coolant passage arranged inside the wall 24 of the second lens tube 20 and the second laser beam reflection material arranged on the inner circumferential surface of the second lens tube 20, or both of them may be used as the second temperature-rise suppressing mechanism 210.

Modification Example

Figure 13:
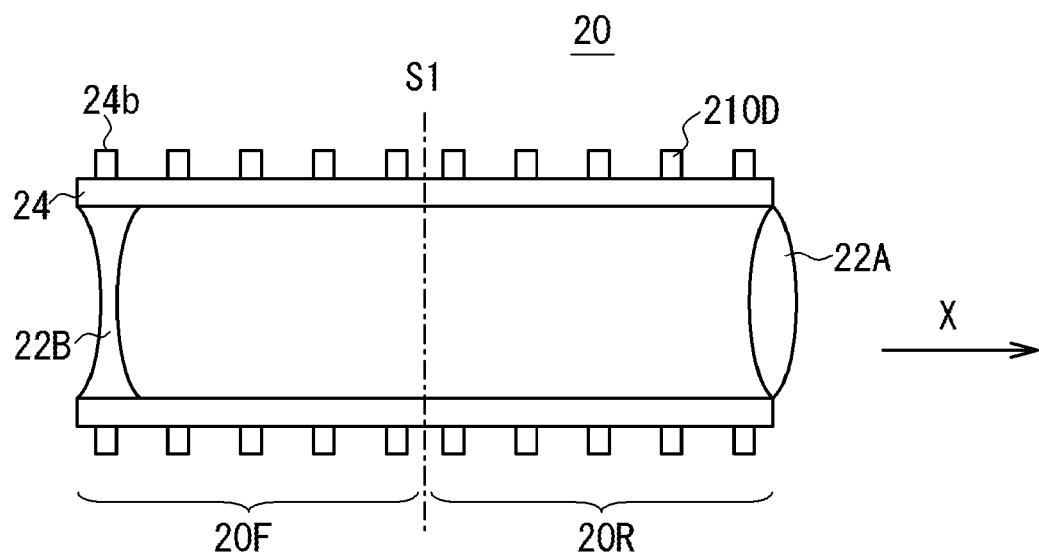
FIG. 13 is a schematic sectional view showing the second lens tube.

FIG. 13 shows a modification example of the second lens tube 20 and the second temperature-rise suppressing mechanism 210. FIG. 13 is a schematic sectional view of the second lens tube 20.

In the example shown in FIG. 13, the second lens tube 20 has second radiation fins 210D arranged on the outer circumferential surface 24b of the second lens tube as the second temperature-rise suppressing mechanism 210. The shape of each second radiation fin 210D is optional. The shape of of each second radiation fin 210D may be a column shape and may be a board shape. When the shape of the second radiation fin 210D is a board shape, the board surface may be parallel to the X axis, may be perpendicular to the X axis, or may be diagonal to the X axis.

In the example shown in FIG. 13, the plurality of second radiation fins 210D are arranged to be uniformly distributed on the outer circumferential surface of the second lens tube 20. Alternatively, the plurality of second radiation fins 210D may be arranged to become denser in the rear section 20R of the second lens tube than the front section 20F of the second lens tube.

Figure 14:
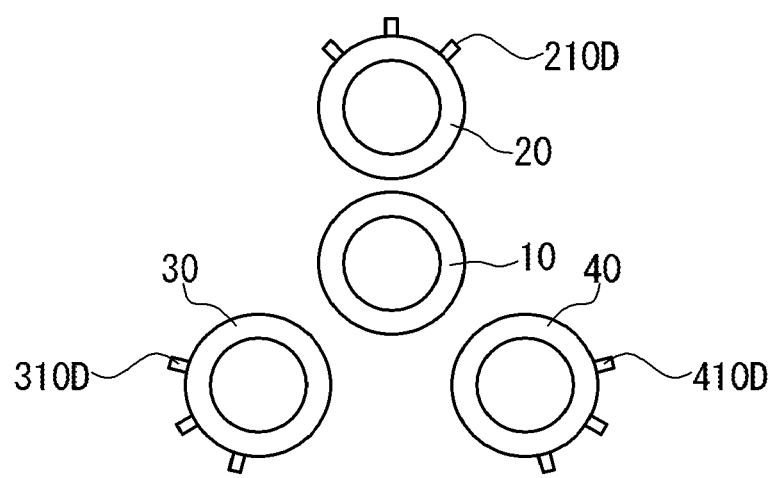
FIG. 14 is a sectional view of the first to fourth lens tubes in a plane perpendicular to the longitudinal direction of the first lens tube.

Alternatively or additionally, as shown in FIG. 14, the second radiation fins 210D may be arranged to be prominent for the region where any lens tube does not exist. In other words, the second radiation fins 210D may be arranged so as not to be prominent for the region where the other lens tube exists. In the example shown in FIG. 14, any heat radiation fin is not arranged in the first lens tube 10. Also, in the example shown in FIG. 14, the third heat radiation fins 310D are arranged to be prominent for the region where any lens tube does not exist. In the same way, the fourth radiation fins 410D are arranged to be prominent for the region where any lens tubes (the plurality of lens tubes) do not exist. Note that FIG. 14 is a sectional view of the first lens tube 10 to the fourth lens tube 40 and a sectional view by a plane perpendicular to the longitudinal direction of the first lens tube 10.
(Third Lens Tube and Third Temperature-Rise Suppressing Mechanism)

The third lens tube 30 and the third temperature-rise suppressing mechanism 310 may have the same configurations as the second lens tube 20 and the second temperature-rise suppressing mechanism 210, and may be different in configuration. Also, the fourth lens tube 40 and the fourth temperature-rise suppressing mechanism 410 may have the same configurations as the second lens tube 20, second temperature-rise suppressing mechanism 210 and may be different in configuration.

When the laser array device 9 has an $N^{th}$ lens tube (N is an natural number equal to or more than 1) and an $N^{th}$ temperature-rise suppressing mechanism, the $N^{th}$ lens tube and the $N^{th}$ temperature-rise suppressing mechanism may be the same configurations as the first lens tube and the first temperature-rise suppressing mechanism, respectively. Alternatively, the $N^{th}$ lens tube and the $N^{th}$ temperature-rise suppressing mechanism may have the same configurations as the second lens tube and the second temperature-rise suppressing mechanism. Alternatively, the $N^{th}$ lens tube and the $N^{th}$ temperature-rise suppressing mechanism may be the configurations which are different from the first lens tube and the second lens tube, the first temperature-rise suppressing mechanism and the second temperature-rise suppressing mechanism.

Second Modification Example

In the example shown in FIG. 7 to FIG. 14, the plurality of lens tubes are arranged to be separate from each other. Alternatively, at least two of the plurality of lens tubes may be arranged to be in contact with each other. By arranging two lens tubes to be in contact with each other, the depth L1 of a synthetic laser beam which is formed from the two laser beams which are irradiated from the two lens tubes can be made longer (Referring to FIG. 3, if necessary).

Figure 15:
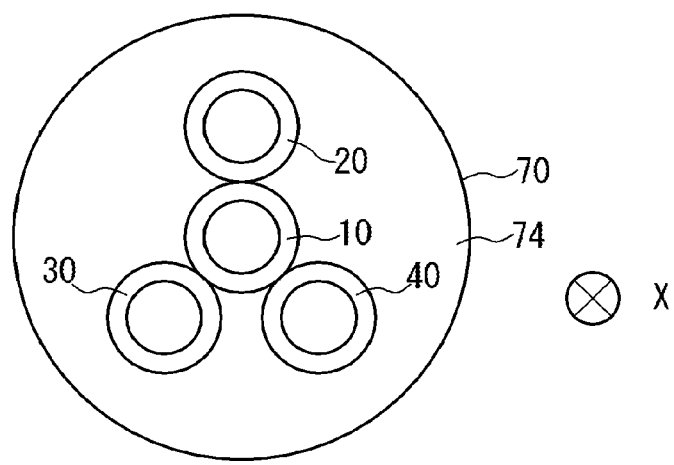
FIG. 15 is a schematic front view showing a housing when being viewed from the positive direction of the X axis to the negative direction.

FIG. 15 shows an example of the second modification example. FIG. 15 is a schematic front view of the housing 70 when being viewed to the negative direction from the positive direction of the X axis. In the example shown in FIG. 15, the first lens tube 10 and the second lens tube 20 are arranged in contact with each other, and the first lens tube 10 and the third lens tube 30 are arranged in contact with each other, and the first lens tube 10 and the fourth lens tube 40 are arranged in contact with each other. As a result, the depth of a synthetic laser beam which is formed from the plurality of laser beams irradiated from the plurality of lens tubes (four lens tubes in the example shown in FIG. 15) can be made longer.

Third Modification Example

In an example shown in FIG. 5 or FIG. 13, of the optical elements arranged in the lens tube, a lens arranged on the laser beam incidence side is a diffusion lens (e.g. a concave lens), and a lens arranged on the laser beam emitting side is a condenser lens (e.g. a convex lens). Alternatively, the lens arranged on the laser beam incidence side may be a condenser lens (e.g. a convex lens), and the lens arranged on the laser beam emitting side may be a condenser lens (e.g. a convex lens).

Figure 16:
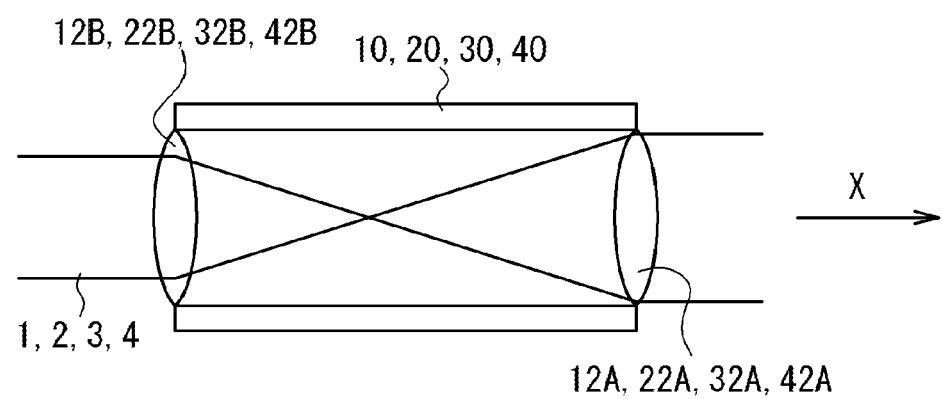
FIG. 16 is a schematic sectional view showing the lens tube.

FIG. 16 shows an example of the third modification example. FIG. 16 is a schematic sectional view showing the lens tube (10, 20, 30, and 40). In the example shown in FIG. 16, the lens (12B, 22B, 32B, 42B) arranged on the laser beam incidence side is a condenser lens (e.g. a convex lens) and the lens (12A, 22A, 32A, 42A) arranged on the laser beam emitting side is a condenser lens (e.g. a convex lens).

Fourth Modification Example

Figure 17:
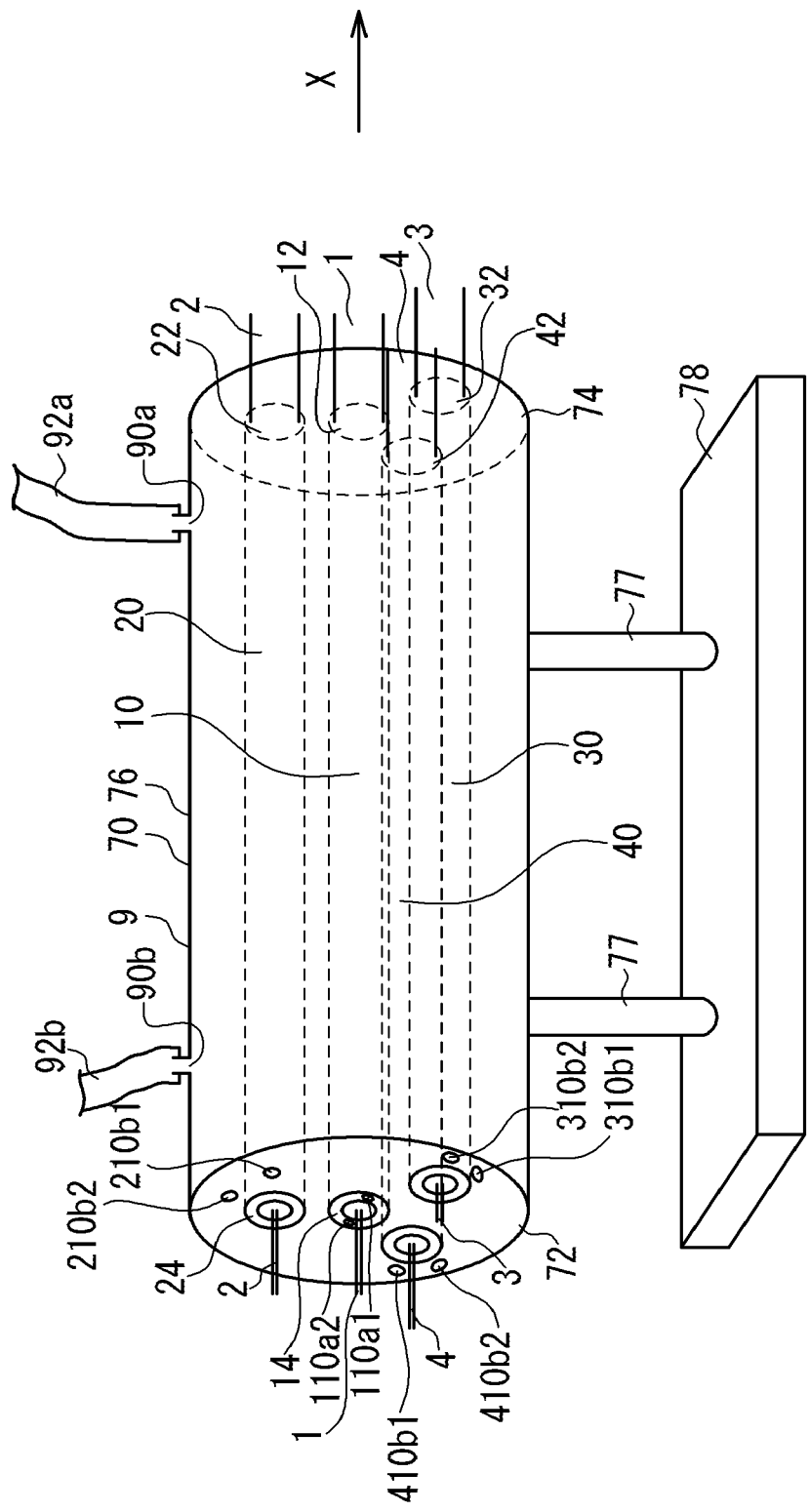
FIG. 17 is a schematic perspective view showing an example of configuration of the laser array device.

FIG. 17 shows an example of the fourth modification example. FIG. 17 is a schematic perspective view showing an example of the configuration of the laser array device 9. In the example shown in FIG. 17, as a temperature-rise suppressing mechanism for the plurality of lens tubes (10, 20, 30, 40), a cooling air supply mechanism is additionally provided to supply the cooling air into the housing 70. The cooling air supply mechanism has an air input port 90a to supply air into the housing 70, and an air output port 90b to discharge the air from the housing 70. The cooling air supply mechanism has an air supply pipe 92a connected with the air input port 90a, an air output pipe 92b connected with the air output port 90b, and an air supply pump (not shown) connected with the air supply pipe 92a.

Note that the cooling air supply mechanism is not the temperature-rise suppressing mechanism arranged in each lens tube. Therefore, the cooling air supply mechanism cannot control the temperature rise for every lens tube. Therefore, in the fourth modification example, the cooling air supply mechanism and the temperature-rise suppressing mechanism arranged in each lens tube are both used.

Figure 18A:
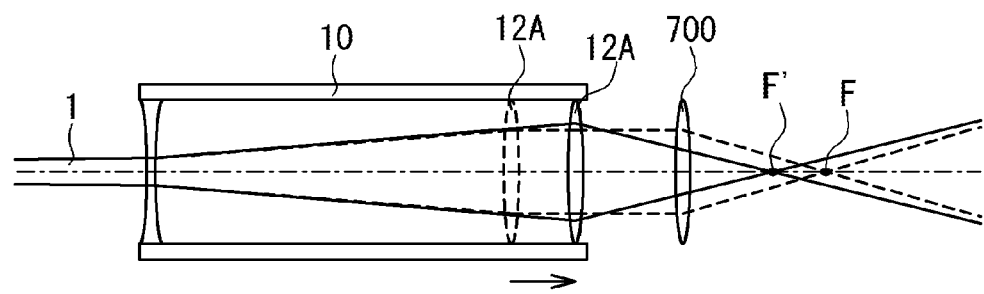
FIG. 18A is a schematic longitudinal sectional view showing a state that a focus position moves according to an extension of the first lens tube.

FIG. 18A is a schematic longitudinal sectional view showing the state that a focus position moves (from a position F to a position F') due to the extension of the first lens tube 10. In the laser array device according to some embodiments, the first lens tube 10 has the first temperature-rise suppressing mechanism. Since the first lens tube 10 has the first temperature-rise suppressing mechanism, the extension of the first lens tube 10 due to the temperature rise is suppressed. As a result, a shift of the focus position of the laser beam emitted from the first lens tube 10 (the movement of the focus position) is suppressed.

Figure 18B:
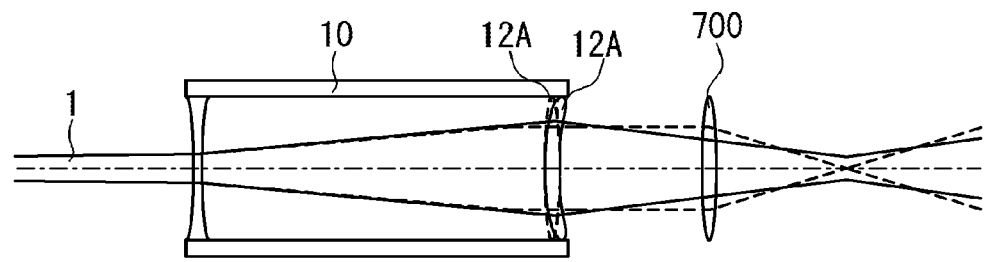
FIG. 18B is a schematic longitudinal sectional view showing a state that condensation performance of a lens declines due to warp of the lens arranged in the first lens tube.

FIG. 18B is a schematic longitudinal sectional view showing the state that the light collection performance of the lens declines due to the warp of lens 12A arranged in the first lens tube 10. In the laser array device according to some embodiments, the first lens tube 10 has the first temperature-rise suppressing mechanism. Since the first lens tube 10 has the first temperature-rise suppressing mechanism, the warp of lens 12A due to the temperature rise is suppressed. As a result, the decline of the light collection performance of the laser beam emitted from the first lens tube 10 is suppressed.

Figure 18C:
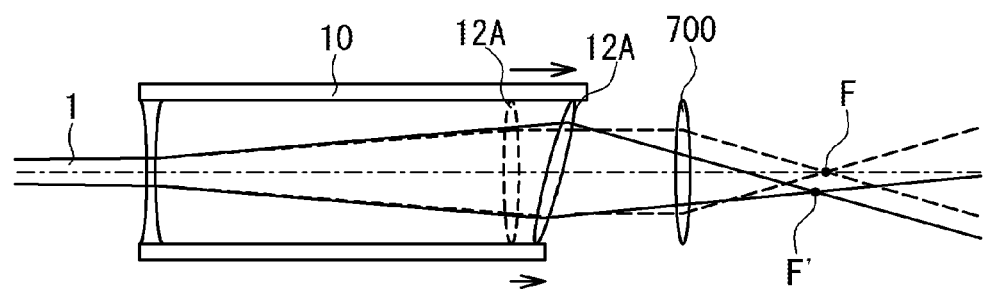
FIG. 18C is a schematic longitudinal sectional view showing a state that the focus position of the first lens tube moves due to asymmetrical extension with respect to the longitudinal center axis of the first lens tube.

FIG. 18C is a schematic longitudinal sectional view showing the state that the focus position moves (from the position F to the position F') due to the extension of the first lens tube 10 which is asymmetry with respect to the longitudinal center axis of the first lens tube 10. The asymmetrical extension of the first lens tube 10 is caused by, for example, the first lens tube 10 arranged to be adjacent to the other lens tube. In the laser array device according to some embodiments, the first lens tube 10 has the first temperature-rise suppressing mechanism. Since the first lens tube 10 has the first temperature-rise suppressing mechanism, the asymmetrical extension of the first lens tube 10 due to the temperature rise is suppressed. As a result, a shift of the focus position of the laser beam emitted from the first lens tube 10 (the movement of the focus position) is suppressed. Note that the first temperature-rise suppressing mechanism 10 may be arranged to be asymmetry to the longitudinal center axis of the first lens tube 10 for the purpose to suppress the asymmetrical extension of the first lens tube 10.

Note that it is assumed that the warp is caused in the lens 12A due to the asymmetry extension of the first lens tube 10 with respect to the longitudinal center axis of the first lens tube 10. Or, it is assumed that the first lens tube 10 curves due to the asymmetry extension of the first lens tube 10 with respect to the longitudinal center axis of the first lens tube 10. In the laser array device according to some embodiments, the first lens tube 10 has the first temperature-rise suppressing mechanism. Since the first lens tube 10 has the first temperature-rise suppressing mechanism, the asymmetrical extension of the first lens tube 10 due to the temperature rise is suppressed.

Especially, it is difficult to correct the degradation of the optical characteristic due to the warp of lens 12A. Therefore, it is desirable to arrange the first temperature-rise suppressing mechanism in the first lens tube 10 to suppress the warp of lens 12A.

It would be apparent that the present invention is not limited to each of the above embodiments, and that each embodiment may be changed or modified appropriately in the range of the technical thought of the present invention. Various techniques used in each embodiment or modification example can be applied to another embodiment or modification example, unless the technical contradiction occurs.

This application is based on Japan patent application 2015-55367 filed on Mar. 18, 2015, and claims a priority based on the Japan patent application 2015-55367. The disclosure thereof is incorporated herein by reference.

The invention claimed is:

1. A laser array device used in a laser irradiation system which comprises a plurality of laser beam output sections provided to output a plurality of laser beams to the laser array device, wherein the laser array device is configured to emit a plurality of output laser beams based on the plurality of laser beams so as to focus the plurality of output laser beams at a target point, the laser array device comprising:
    a plurality of lens tubes comprising a first lens tube through which a first laser beam passes and a second lens tube through which a second laser beam passes, the first laser beam and the second laser beam are ones of the plurality of laser beams corresponding to the first lens tube and the second lens tube, respectively;
    a support mechanism disposed to support the plurality of lens tubes such that the plurality of lens tubes are parallel to each other;
    a plurality of first lenses arranged in the first lens tube;
    a plurality of second lenses arranged in the second lens tube;
    a first temperature-rise suppressing mechanism disposed inside a peripheral wall of the first lens tube to suppress temperature rise of the first lens tube; and
    a second temperature rise suppressing mechanism disposed inside a peripheral wall of the second lens tube to suppress temperature rise of the second lens tube,
    wherein the plurality of first lenses comprises an incident-side lens arranged on a laser beam incident-side and an emitting-side lens arranged on a laser beam emitting side,
    wherein the plurality of second lenses comprises an incident-side lens arranged on a laser beam incident-side and an emitting-side lens arranged on a laser beam emitting side, and
    the first temperature rise suppressing mechanism comprises a temperature rise suppressing mechanism of a different type from the second temperature rise suppressing mechanism.

2. The laser array device according to claim 1, wherein each of the plurality of laser beam output sections is configured to receive an incident laser beam, amplify the incident laser beam, and output the amplified laser beam as one of the plurality of laser beams to the laser array device.

3. The laser array device according to claim 1, wherein the first lens tube is surrounded by remaining ones of the plurality of lens tubes, and
    wherein the second lens tube is contained in the remaining ones.

4. The laser array device according to claim 1, wherein the first lens tube is surrounded by remaining ones of the plurality of lens tubes, and
    wherein the first temperature-rise suppressing mechanism comprises temperature-rise suppressing mechanisms of at least two types.

5. The laser array device according to claim 4, wherein the first temperature-rise suppressing mechanism comprises the temperature-rise suppressing mechanism of at least three types.

6. The laser array device according to claim 1, wherein the first temperature-rise suppressing mechanism comprises a first coolant passage provided for the first lens tube.

7. The laser array device according to claim 6, wherein the first coolant passage comprises a first inner coolant passage disposed inside a wall of the first lens tube.

8. The laser array device according to claim 6, wherein the first coolant passage is provided more densely in a rear section of the first lens tube than in a front section of the first lens tube.

9. The laser array device according to claim 6, further comprising:
    a housing in which the plurality of lens tubes are arranged, wherein the housing comprises:
    a beam incident-side end wall on which a first laser beam is incident; and
    a beam emitting-side end wall from which the first laser beam is emitted, and
    wherein a first coolant input port used to supply coolant to the first coolant passage and a first coolant output port used to discharge the coolant from the first coolant passage are arranged on an end surface of the first lens tube on which the first laser beam is incident or on the beam incidence-side end wall.

10. The laser array device according to claim 1, wherein the first temperature-rise suppressing mechanism comprises a first laser beam reflection material arranged on an inner circumferential surface of the first lens tube, and
wherein the first laser beam reflection material reflects light which does not travel from the incident side lens to the emitting side lens.

* * * * *